(12) United States Patent
Yamanaka et al.

(10) Patent No.: US 8,816,437 B2
(45) Date of Patent: Aug. 26, 2014

(54) SEMICONDUCTOR DEVICE AND METHOD FOR MANUFACTURING SAME

(75) Inventors: Masaki Yamanaka, Osaka (JP); Kazushige Hotta, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 114 days.

(21) Appl. No.: 13/703,987

(22) PCT Filed: Jun. 13, 2011

(86) PCT No.: PCT/JP2011/063482
§ 371 (c)(1),
(2), (4) Date: Dec. 13, 2012

(87) PCT Pub. No.: WO2011/158780
PCT Pub. Date: Dec. 22, 2011

(65) Prior Publication Data
US 2013/0146879 A1  Jun. 13, 2013

(30) Foreign Application Priority Data

Jun. 15, 2010 (JP) ................. 2010-136347

(51) Int. Cl.
| | | |
|---|---|---|
| *H01L 21/84* | (2006.01) | |
| *H01L 27/12* | (2006.01) | |
| *H01L 29/786* | (2006.01) | |
| *H01L 33/00* | (2010.01) | |
| *H01L 27/11* | (2006.01) | |
| *H01L 27/092* | (2006.01) | |
| *G02F 1/1362* | (2006.01) | |

(52) U.S. Cl.
CPC ............ *H01L 27/092* (2013.01); *H01L 29/786* (2013.01); *G02F 2001/136245* (2013.01); *H01L 33/0041* (2013.01); *H01L 27/1108* (2013.01); *G02F 1/136204* (2013.01); *H01L 29/78696* (2013.01); *H01L 27/1222* (2013.01); *H01L 27/11* (2013.01)
USPC ............ 257/350; 257/E21.411; 257/E27.112; 438/154

(58) Field of Classification Search
CPC ................ H01L 27/12; H01L 27/1214; H01L 29/78621; H01L 29/42384; H01L 29/66757
See application file for complete search history.

(56) References Cited

U.S. PATENT DOCUMENTS

| | | | |
|---|---|---|---|
| 5,145,796 A * | 9/1992 | Adan et al. ................. | 438/157 |
| 2002/0098635 A1 | 7/2002 | Zhang et al. | |
| 2003/0160245 A1 | 8/2003 | Kurosawa | |

FOREIGN PATENT DOCUMENTS

| | | |
|---|---|---|
| JP | 2000-196096 A | 7/2000 |
| JP | 2002-343976 A | 11/2002 |
| JP | 2003-258262 A | 9/2003 |
| WO | 2011/096387 A1 | 8/2011 |
| WO | 2011/135890 A1 | 11/2011 |

OTHER PUBLICATIONS

U.S. Appl. No. 13/695,217, filed Oct. 30, 2012.

* cited by examiner

*Primary Examiner* — Michael Lebentritt
*Assistant Examiner* — Kevin Quinto
(74) *Attorney, Agent, or Firm* — Chen Yoshimura LLP

(57) ABSTRACT

Disclosed is a semiconductor device in which an n-channel type first thin film transistor and a p-channel type second thin film transistor are provided on the same substrate. The first thin film transistor has a first semiconductor layer (11), and the second thin film transistor has a second semiconductor layer (20), a third semiconductor layer (21), and a fourth semiconductor layer (22). The first semiconductor layer (11), the second semiconductor layer (20), the third semiconductor layer (21) and the fourth semiconductor layer (22) are formed of the same film, and the first and second semiconductor layers (11, 20) respectively have slanted portions (11e, 20e) positioned at respective peripheries, and main portions (11m, 20m) made of portions other than the slanted portions. A p-type impurity is implanted into the slanted portion (11e) of the first semiconductor layer at a concentration higher than that in the main portion (11m) of the first semiconductor layer and that in the main portion (20m) of the second semiconductor layer.

18 Claims, 18 Drawing Sheets

(a)

(b)  (c)

(d)

(a)

(b)

(a)

(b)

(a)

(b)

(a)

(b)

(a)

(b)

(a)

(b)

(a)

(b)

(a)

(b)

(a)

(b)

(c)

(a)

(b)

(a)

(b)

(a)

(b)

SEMICONDUCTOR DEVICE AND METHOD FOR MANUFACTURING SAME

TECHNICAL FIELD

The present invention relates to a semiconductor device provided with thin film transistors (TFTs), and to a method of manufacturing the same.

BACKGROUND ART

A semiconductor device having p-channel type and n-channel type thin film transistors (TFTs) formed on the same substrate, and an electronic device equipped with such a semiconductor device have been developed (Patent Documents 1 and 2, for example).

In an active matrix liquid crystal display device or an organic EL display device, for example, a technique for integrally forming a driver circuit on an active matrix substrate has been proposed. A typical driver circuit uses a CMOS (Complementary Metal Oxide Semiconductor) that includes a p-channel type TFT (abbreviated to "p-type TFT" below) and an n-channel type TFT (abbreviated to "n-type TFT" below). In order to prevent an occurrence of a leak current in the configuration using the CMOS, driving voltages of the respective TFTs need to be adjusted such that the two types of TFTs, which constitute the CMOS, are both turned off when the gate voltage is not applied. Also, from the perspective of reducing power consumption, a reduction in driving voltages of the TFTs is sought after.

In an active matrix liquid crystal display device or an organic EL display device, a technique for providing a memory circuit in each pixel on the active matrix substrate has also been proposed (Patent Document 1 and the like). With this configuration, image data of each pixel can be stored in the memory circuit (referred to as "image memory" below) provided in the pixel, which makes it possible to continuously display a still image without receiving a supply of image data from the outside, thereby reducing the power consumption for image display.

For the image memory, the use of a DRAM (Dynamic Random Access Memory) or an SRAM (Static Random Access Memory) has been proposed. Between the two, the SRAM is able to operate faster than the DRAM, and because there is no need to perform a refresh operation, which is required in the DRAM, the power consumption can be reduced in the SRAM. The SRAM has a flip-flop circuit that uses a plurality of TFTs including p-type and n-type TFTs. Even if a display device is provided with such image memories, a further reduction in driving voltages may be needed, depending on applications in which the display device is used.

In order to further reduce a driving voltage in the above-mentioned display device, which is equipped with both the p-type and n-type TFTs, it is necessary to minimize respective threshold voltages Vth of the p-type TFT and the n-type TFT.

However, between the p-type TFT and the n-type TFT, the respective voltage-current characteristics (Vg-Id characteristics) differ (see FIG. 18, for example). Therefore, it is difficult to set the value of the threshold voltage Vth such that both TFTs are turned off when the gate voltage Vg is 0V (i.e., normally off). The reason for this will be described in detail below.

A typical semiconductor layer in a TFT is patterned to have a slanted portion (tapered portion) on the periphery thereof, and in the semiconductor layer, the threshold voltage Vth differs between the slanted portion and a planarized portion that has a flat surface. Specifically, as shown in FIG. 13, in both the n-type TFT and the p-type TFT, the voltage-current curve of the slanted portion is shifted to the lower voltage side as compared with the voltage-current curve of the planarized portion. This phenomenon is presumably caused by damage given to the slanted portion of the semiconductor layer during an etching process or an ashing process of the semiconductor film (silicon film).

FIGS. 14(a) and 14(b) are graphs that respectively show examples of the voltage-current characteristics of the n-type TFT and the p-type TFT. The voltage-current characteristics of the respective TFTs are indicated by the solid lines. The voltage-current characteristics of the planarized portion and the slanted portion are indicated by the dashed lines. As shown in the figures, the voltage-current characteristics of each TFT are represented by a curve that is obtained by combining the voltage-current curve of the planarized portion and the voltage-current curve of the slanted portion. FIG. 15 is a plan view of the n-type TFT, schematically showing a path in which the drain current flows. FIG. 16 is a diagram for illustrating an adjustment of the threshold voltage Vth in the n-type TFT.

As shown in FIG. 14(a), in the voltage-current characteristics of the n-type TFT, the drain current Id changes in two steps upon driving up with an increase in the gate voltage Vg. (So-called "hump" appears.) This is because the drain current Id (e) (see FIG. 15) that flows through the slanted portion of the semiconductor layer 11 starts increasing at a lower voltage Vg(e), and the drain current Id(m) (see FIG. 15) that flows through the planarized portion of the semiconductor layer 11 starts increasing at a voltage Vg(m) that is higher than Vg(e). That is, the slanted portion of the semiconductor layer 11 functions as a parasitic transistor, and the characteristics thereof largely affect the voltage-current characteristic of the entire n-type TFT.

As shown in FIG. 16, in the n-type TFT, when a p-type impurity is doped (channel-doped) into the semiconductor layer thereof, for example, the voltage-current curve of the n-type TFT can be shifted to the higher voltage side. Therefore, it is possible to make an adjustment such that the drain current Id becomes the smallest (off state) when the gate voltage Vg is 0V. However, when such an adjustment is made, the threshold voltage Vth is also shifted to the higher voltage side, and therefore, it is not possible to maintain the threshold voltage Vth at a low level.

On the other hand, in the p-type TFT, as shown in FIG. 14(b), the drain current Id(m) (see FIG. 15) that flows through the planarized portion starts increasing at a voltage Vg(m), and the drain current Id(e) (see FIG. 15) that flows through the slanted portion starts increasing at the voltage Vg(e) (Vg(m) >Vg(e)). The drain current Id(e) that flows through the slanted portion is significantly smaller than the drain current Id(m) that flows through the planarized portion. Therefore, in the p-type TFT, the characteristics of the parasitic transistor in the slanted portion are covered by the characteristics of the planarized portion, and are therefore not shown. Thus, in the p-type TFT, even when an adjustment is made such that the drain current Id becomes the smallest (off state) when the gate voltage Vg is 0V by introducing a p-type impurity into the channel region of the semiconductor layer, the threshold voltage Vth can be kept at a low level.

As described above, in the p-type TFT, it is possible to make an adjustment such that the TFT is turned off when the gate voltage Vg is 0V, while maintaining the threshold voltage Vth at a low level. However, in the n-type TFT, it is difficult to do so because of the characteristics of the parasitic transistor in the n-type TFT.

To solve this problem, Patent Document 1 discloses a technique of introducing a p-type impurity into the slanted portion of the semiconductor layer of the n-type TFT at a higher concentration than that in the planarized portion thereof. This makes it possible to move the voltage-current curve of the parasitic transistor of the slanted portion so as to be masked by the voltage-current curve of the planarized portion.

FIGS. 17(a) and 17(b) respectively show cross-sectional views for explaining a method of manufacturing the n-type TFT and the p-type TFT disclosed in Patent Document 1. FIG. 17(a) is a cross-sectional view of the semiconductor layer of the n-type TFT, and FIG. 17(b) is a cross-sectional view of the semiconductor layer of the p-type TFT. Below, with reference to FIG. 17, the method disclosed in Patent Document 1 will be explained.

First, on a substrate 241, a base insulating film 242 is formed, and after forming a semiconductor film thereon, the semiconductor film is doped with a p-type impurity (boron). Next, on the semiconductor film, a mask film made of a silicon oxide film, for example, is formed. Next, in an n-type TFT forming region and a p-type TFT forming region on the substrate 241, resist films that cover parts of the mask film are respectively formed. Thereafter, using the resist films as masks, the semiconductor film and the mask film are etched into island shapes.

This way, as shown in FIG. 17, island-shaped semiconductor layer 243n and mask layer 244n are formed in the n-type TFT forming region, and island-shaped semiconductor layer 243p and mask layer 244p are formed in the p-type TFT forming region. In this etching, the edge portions of the resist films in the respective TFT forming regions gradually recede. Along with this, portions of the semiconductor films that are protruding from the resist films and the mask films 244n and 244p are etched so as to be thinner as they go further from the edge portions of the mask layers 244n and 244p. As a result, slanted portions are formed in the peripheries of the semiconductor layers 243n and 243p.

As shown in FIGS. 17(a) and 17(b), after removing the resist films, a resist film R4 is formed to cover the semiconductor layer 243p in the p-type TFT forming region, but not to cover the semiconductor layer 243n in the n-type TFT forming region.

Next, a p-type impurity that is set so as to pass through the mask layer 244n is implanted into the entire semiconductor layer 243n. Subsequently, a p-type impurity that is set so as not to pass through the mask layer 244n is selectively implanted into a portion not covered by the mask layer 244n, which is the slanted portion of the semiconductor layer 243n. This way, the slanted portion of the semiconductor layer 243n is doped with twice to five times as much p-type impurity as that in the planarized portion in volume density. As described, in the n-type TFT, by introducing a p-type impurity into the slanted portion at a higher concentration than that in the planarized portion, the voltage-current curve of the parasitic transistor of the slanted portion can be shifted to the higher voltage side, thereby suppressing the effect of the parasitic transistor of the slanted portion of the semiconductor layer 243n.

Next, the resist film R4 is removed, and thereafter, an insulating film and a gate electrode (not shown) are formed on the mask layers 244n and 244p. The mask layers 244n and 244p and the insulating film are used as a gate insulating film.

RELATED ART DOCUMENTS

Patent Documents

Patent Document 1: Japanese Patent Application Laid-Open Publication No. 2003-258262

Patent Document 2: Japanese Patent Application Laid-Open Publication No. 2000-196096

SUMMARY OF THE INVENTION

Problems to be Solved by the Invention

In the conventional method shown in FIG. 17, the gate insulating film formed on portions other than the slanted portions (i.e., planarized portions) of the semiconductor layers 243n and 243p is made of two layers of the mask layer 244n or 244p and the insulating film formed thereon. On the other hand, because the mask layers are not formed on the slanted portions of the semiconductor layers 243n and 243p, the gate insulating film formed thereon is made of a single layer. This causes the breakdown voltage in the slanted portions of the semiconductor layers 243n and 243p to be lower than that in the planarized portions.

Also, in order to minimize the threshold voltage Vth of the TFT, it is necessary not only to suppress the effect of the parasitic transistor, but also to reduce the thickness of the gate insulating film. However, with the above-mentioned method, the gate insulating film is made of two layers, and therefore, it is not possible to sufficiently reduce the thickness thereof. If the mask layers 244n and 244p are removed, instead of being used as the gate insulating film, the thickness of the gate insulating film could be reduced, but it would create a need for a removal step of the mask layers 244n and 244p in addition to the forming step thereof, thereby increasing the number of process steps. Also, in removing the mask layers 244n and 244p, the base insulating film 242, which is made of the same silicon oxide film as the mask layers 244n and 244p, is etched. This would create steps in the base insulating film 242 at the edge portions of the semiconductor layers 243n and 243p, and as a result, defects such as disconnections of gate wiring would become more likely to occur.

PCT/JP2011/052010 (Japanese Patent Application No. 2010-021616) submitted by the applicant of the present invention discloses a method of manufacturing a TFT that can minimize the threshold voltage of the TFT without forming the mask layer on the semiconductor layer and without increasing the number of manufacturing process steps.

In the method described in the above-mentioned application, the slanted portion of the channel region of the p-type semiconductor layer needs to be removed by etching after being doped with a p-type impurity (boron (B), for example). That means that the p-type semiconductor layer undergoes two etching processes that include this etching process and the etching process performed to form the semiconductor layer. Therefore, the base insulating film that lies under the semiconductor layer and that is made of $SiO_2$, for example, also undergoes two etching processes. FIG. 19 is a cross-sectional view for illustrating steps formed in the base insulating film as a result of the etching processes. Even when the selection ratio between the semiconductor layer and the base insulating film is set to be sufficiently large (that is, the etching is performed such that the etching rate of the semiconductor layer is made sufficiently larger than the etching rate of the base insulating film), it is not possible to prevent the base insulating film from being etched. Therefore, as shown in FIG. 19, in the first etching, a small step such as a step ds1 is formed in the base insulating film Il at the edge portions of the n-type semiconductor layer S1 and the p-type semiconductor layer S2. When the second etching is thereafter performed for the p-type semiconductor layer S2, a step ds2 may be formed in the step ds1, thereby making the step ds1 greater in a localized area. As a result, at the edge portion of the p-type semiconductor layer S2, a greater step ds3, which includes the thickness of the p-type semiconductor layer S2, is formed, and this step ds3 possibly appears as a step on the surface of the gate insulating film (10 nm to 100 nm thick). In particular, when the step ds3 is twice as large as the thickness of the semiconductor layer S1 (30 nm to 80 nm, for example) or greater, a large step is created on the surface of the gate insulating film. As a result, at the edge portion of the p-type semiconductor layer S2, defects such as a disconnection in a gate wiring line (100 nm to 500 nm thick) formed on the gate insulating film would be more likely to occur. The above-mentioned application is hereby incorporated by reference in its entirety.

The present invention was made in view of the above-mentioned problems, and aims at providing a semiconductor device equipped with an n-type TFT and a p-type TFT that can reduce the occurrence of defects and minimize the threshold voltages of TFTs.

Means for Solving the Problems

A semiconductor device of the present invention includes: a first thin film transistor of n-channel type and a second thin film transistor of p-channel type formed on a single substrate; and an insulating film on which the first and second thin film transistors are formed, wherein the first thin film transistor includes: a first semiconductor layer that has a channel region, a source region, and a drain region; a gate electrode disposed so as to overlap the channel region; and a gate insulating film interposed between the first semiconductor layer and the gate electrode, wherein the second thin film transistor includes: a second semiconductor layer that has a channel region, a source region, and a drain region; a third semiconductor layer and a fourth semiconductor layer that are disposed at opposite sides of the second semiconductor layer; a gate electrode disposed so as to overlap the channel region and the third and fourth semiconductor layers; and a gate insulating film interposed between the second semiconductor layer and the gate electrode, wherein the first, second, third, and fourth semiconductor layers are formed of a same film, wherein the first and second semiconductor layers respectively have slanted portions located on peripheries and main portions that are made of portions other than the slanted portions, wherein the slanted portion of the channel region of the first semiconductor layer is doped with a p-type impurity at a higher concentration than that in the main portion of the first semiconductor layer and the main portion of the second semiconductor layer, and wherein the slanted portion of the channel region of the second semiconductor layer is doped with the p-type impurity at a lower concentration than that in the slanted portion of the channel region of the first semiconductor layer.

In one embodiment, a step formed on a surface of a base film lying under the gate electrode is not larger than a thickness of the second semiconductor layer.

In one embodiment, the concentration of the p-type impurity in the main portion of the second semiconductor layer is lower than the concentration of the p-type impurity in the main portion of the first semiconductor layer.

In one embodiment, the third and fourth semiconductor layers respectively have slanted portions that extend along a channel direction when viewed from a normal direction to a plane of the single substrate, and wherein, of those slanted portions, portions that are located on respective sides that are opposite to the second semiconductor layer are doped with the p-type impurity at a higher concentration than that in the slanted portion of the channel region of the second semiconductor layer.

In one embodiment, the gate insulating film is formed so as not to be thicker than the first and second semiconductor layers.

In one embodiment, the thickness of the gate insulating film is 50 nm or less.

In one embodiment, the first, second, third, and fourth semiconductor layers include a catalytic element that facilitates crystallization of an amorphous semiconductor film.

In one embodiment, the catalytic element includes one or a plurality of types of elements selected from Ni, Co, Sn, Pb, Pd, Fe, and Cu.

In one embodiment, the semiconductor device further includes an SRAM circuit, and the SRAM circuit has the first thin film transistor and the second thin film transistor.

A display device according to the present invention includes the above-mentioned semiconductor device and a plurality of pixels, wherein, each of the pixels includes: a pixel electrode; a memory circuit that is connected to the pixel electrode and that stores an image signal; and a display cell that performs display based on the image signal, and wherein the memory circuit includes the SRAM circuit.

A method of manufacturing a semiconductor device according to the present invention is a method of manufacturing a semiconductor device that has a first thin film transistor of n-channel type and a second thin film transistor of p-channel type on a single substrate, the method including: (a) forming an insulating film on the substrate; (b) forming a semiconductor film on the insulating film; (c) forming a first mask film and a second mask film on the semiconductor film; (d) etching the semiconductor film by using the first and second mask films as masks to form a first semiconductor layer that includes a region that becomes a channel region, a source region, and a drain region of the first thin film transistor and to from a semiconductor layer that includes a region that becomes a channel region, a source region, and a drain region of the second thin film transistor, the first semiconductor layer including a main portion that is covered by the first mask film and a slanted portion that is located in a periphery of the first semiconductor layer and that is not covered by the first mask film, the semiconductor layer including a main portion that is covered by the second mask film and a slanted portion that is located in a periphery of the semiconductor layer and that is not covered by the second mask film; (e) doping a p-type impurity into the slanted portion of the first semiconductor layer and the slanted portion of the semiconductor layer using the first and second mask films as masks; (f) removing the first and second mask films; (g) forming a third mask film that entirely covers the first semiconductor layer and a fourth mask film that covers the regions that become the channel region, the source region, and the drain region of the semiconductor layer and a part of the slanted portion of the semiconductor layer, which extends along a channel direction; (h) etching the semiconductor layer using the third and fourth mask films as masks to divide the semiconductor layer into a second semiconductor layer that has a region that becomes the channel region, the source region, and the drain region and into a third semiconductor layer and a fourth semiconductor layer that are located at opposite sides of the second semiconductor layer; and (i) forming a gate electrode so as to overlap the second, third, and fourth semiconductor layers.

In one embodiment, the method of manufacturing a semiconductor device further includes, between the step (h) and the step (i): (j) implanting an n-type impurity into a part of the first semiconductor layer to form the source region and the drain region; and (k) implanting a p-type impurity into a part of the second semiconductor layer to form the source region and the drain region.

In one embodiment, a step formed on a surface of a base film lying under the gate electrode is not larger than a thickness of the second semiconductor layer.

In one embodiment, the concentration of the p-type impurity in the main portion of the second semiconductor layer is lower than the concentration of the p-type impurity in the main portion of the first semiconductor layer.

In one embodiment, the slanted portion of the second semiconductor layer has a portion that is extended along the channel direction, and of the portion that is extended along the channel direction, a portion that overlaps the gate electrode has a lower p-type impurity concentration than a p-type impurity concentration of the slanted portion of the first semiconductor layer.

In one embodiment, the method of manufacturing a semiconductor device further includes, in the step (b), preparing an amorphous semiconductor film that includes, in at least a part thereof, a catalytic element that facilitates crystallization, and performing heat treatment to the amorphous semiconductor film for crystallizing at least part of the amorphous semiconductor film, thereby obtaining the semiconductor film.

In one embodiment, the method of manufacturing a semiconductor device further includes forming a gate insulating film on the first and second semiconductor layers, wherein the gate insulating film is formed so as not to be thicker than the first and second semiconductor layers.

In one embodiment, the thickness of the gate insulating film is 50 nm or less.

Effects of the Invention

According to the present invention, in a semiconductor device that has an n-type TFT and a p-type TFT, it becomes possible to suppress the effect of the parasitic transistor in the n-type TFT to the TFT characteristics without increasing the effects of the parasitic transistor in the p-type TFT to the TFT characteristics. This allows the threshold voltages of the respective TFTs to be further reduced while ensuring that both n-type and p-type TFTs are turned off when the gate voltage Vg is 0V. As a result, the driving voltage of the semiconductor device can be reduced. Also, it is possible to reduce the occurrence of defects caused by a step in the base insulating film.

DETAILED DESCRIPTION OF EMBODIMENTS

As a result of conducting studies based on the descriptions in the above-mentioned application, the inventors of the present invention found a technique for selectively implanting a p-type impurity while reducing occurrences of defects in TFTs, and thus arrived at the present invention.

Below, with reference to figures, a semiconductor device of an embodiment of the present invention will be explained. The semiconductor device of this embodiment is applied to a substrate equipped with CMOS, that is, an active matrix substrate provided with a driver circuit that includes CMOS, for example. Alternatively, the semiconductor device may be applied to an active matrix substrate for a display device that has a memory circuit, which includes n-type TFT and p-type TFT, provided for each pixel.

FIG. 1(a) is a plan view that schematically shows an n-type TFT and a p-type TFT in a semiconductor device of this embodiment. FIGS. 1(b) and 1(c) respectively show cross-sectional views along the line I-I' and the line II-II' in the plan view in FIG. 1(a). FIG. 1(d) is a cross-sectional view along the line III-III' in the plan view in FIG. 1(a). The line I-I' and the line II-II' are perpendicular to the channel direction, and the line III-III' is parallel to the channel direction.

The semiconductor device of this embodiment includes a substrate 1, and an n-type TFT 100 and a p-type TFT 200 that are formed above the substrate 1 through a base insulating film 2.

The n-type TFT 100 includes an island-shaped semiconductor layer 11 that has a source region "s," a drain region "d," and a channel region "c" located therebetween. Above the semiconductor layer 11, a gate electrode G(n) is disposed so as to overlap the channel region through a gate insulating film 3.

Figure 19:
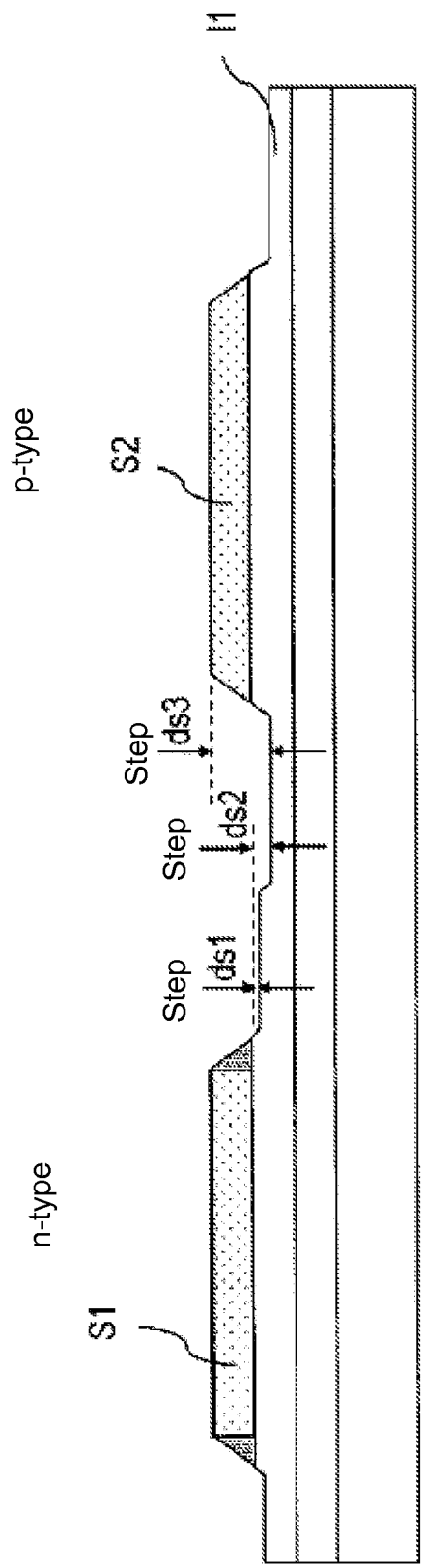
FIG. 19 is a schematic cross-sectional view for illustrating steps in a base insulating film.

Similarly, the p-type TFT 200 includes an island-shaped semiconductor layer 20 that has a source region "s," a drain region "d," and a channel region "c" located therebetween, and semiconductor layers 21 and 22 that are smaller than the semiconductor layer 20. The island-shaped semiconductor layer 20 is formed between the semiconductor layer 21 and the semiconductor layer 22, and the island-shaped semiconductor layer 20 is not directly in contact with the semiconductor layer 21 or 22. Above the semiconductor layer 20, a gate electrode G(p) is disposed so as to overlap the channel region "c" through the gate insulating film 3. Although not shown in FIG. 1(b), small steps such as the step ds1 shown in FIGS. 19 (5 nm to 50 nm high, for example) are formed in the base insulating film 2 at respective edge portions of the semiconductor layers 21 and 22 on the sides not facing the semiconductor layer 20, for example.

On the gate insulating film 3 and the gate electrodes G(n) and G(p), a first interlayer insulating film 4 is formed. In this configuration, the first interlayer insulating film 4 has a two-layered structure that includes an insulating film 4a and an insulating film 4b. On the first interlayer insulating film 4, source electrodes S(n) and S(p) and drain electrodes D(n) and D(p) are disposed. The source region and the drain region of the semiconductor layer 11 are respectively connected to the source electrode S(n) and the drain electrode D(n) through contact portions 9(n) and 10(n) in contact holes formed in the first interlayer insulating film 4. Similarly, the source region and the drain region of the semiconductor layer 20 are respectively connected to the source electrode S(p) and the drain electrode D(p) through contact portions 9(p) and 10(p) in contact holes formed in the first interlayer insulating film 4.

On the first interlayer insulating film 4, a second interlayer insulating film (also referred to as a protective film) 6 is formed. On the second interlayer insulating film 6, an electrode film 8 is formed. In this example, the source electrode S(p) and the drain electrode D(n) are connected to the electrode film 8 through a contact hole formed in the second interlayer insulating film 6 such that the n-type TFT 100 and the p-type TFT 200 constitute a CMOS. The source electrodes and the drain electrodes are connected to wiring lines that are appropriately selected in accordance with the circuit configuration.

When the semiconductor device of this embodiment is applied to a display device, it is preferable that the electrode film 8 be formed of the same conductive material as pixel electrodes. The pixel electrodes may be reflective electrodes made of Al, an Al alloy, or the like, or may be transparent electrodes made of ITO (Indium Tin Oxide) or the like, for example. This way, the pixel electrodes and the electrode film 8 can be formed simultaneously, using the same conductive film.

In this embodiment, the semiconductor layer 11 and the semiconductor layers 20, 21, and 22 are formed of the same semiconductor film. The semiconductor layer 11 has a slanted portion 11e formed in the periphery thereof and a main portion 11m that is made of a portion other than the slanted portion. Similarly, the semiconductor layer 20 has a slanted portion 20e formed in the periphery thereof and a main portion 20m that is made of a portion other than the slanted portion. Similarly, the semiconductor layer 21 has a slanted portion 21e formed in the periphery thereof and a main portion 21m that is made of a portion other than the slanted portion. Similarly, the semiconductor layer 22 has a slanted portion 22e formed in the periphery thereof and a main portion 22m that is made of a portion other than the slanted portion.

In the present specification, in the semiconductor layer that has side faces inclined relative to the plane of the substrate 1, a portion (tapered portion) that is sandwiched by the inclined side face and the lower surface of the semiconductor layer is referred to as a "slanted portion." A portion sandwiched by the upper surface and the lower surface of the semiconductor layer is referred to as a "main portion." In the examples shown in the figures, the upper surfaces of the main portions 11m and 20m to 22m are substantially flat, but it is also possible that the respective surfaces have recesses and protrusions, such as recesses and protrusions that the semiconductor film has before patterning, for example.

The slanted portion 11e located at the periphery of the semiconductor layer 11 is doped with a p-type impurity at a higher concentration than that in the main portion 11m of the semiconductor layer 11 and the main portion 20m of the semiconductor layer 20. On the other hand, in the slanted portion 20e of the semiconductor layer 20, a portion that overlaps the gate electrode G(p) (portion located at the edge of the channel region "c") has a p-type impurity at a lower concentration than the concentration of the p-type impurity in the slanted portion 11e of the semiconductor layer 11. In the slanted portion 20e, a portion that does not overlap the gate electrode G(p) may be doped with the p-type impurity at a high concentration that is substantially the same level as that of the slanted portion 11e of the semiconductor layer 11. In the slanted portion 21e located in the periphery of the semiconductor layer 21, a portion on the side closer to the semiconductor layer 20 is doped with the p-type impurity at substantially the same concentration as that of the main portion 20m of the semiconductor layer 20. In the slanted portion 21e located in the periphery of the semiconductor layer 21, a portion on the side opposite to the semiconductor layer 20 is doped with the p-type impurity at the same concentration as that of the slanted portion 11e of the semiconductor layer 11. In the slanted portion 22e located in the periphery of the semiconductor layer 22, a portion on the side closer to the semiconductor layer 20 is doped with the p-type impurity at the same concentration as that of the main portion 20m of the semiconductor layer 20. A portion thereof on the side opposite to the semiconductor layer 20 is doped with the p-type impurity at substantially the same concentration as that of the slanted portion 11e of the semiconductor layer 11.

Figure 10:
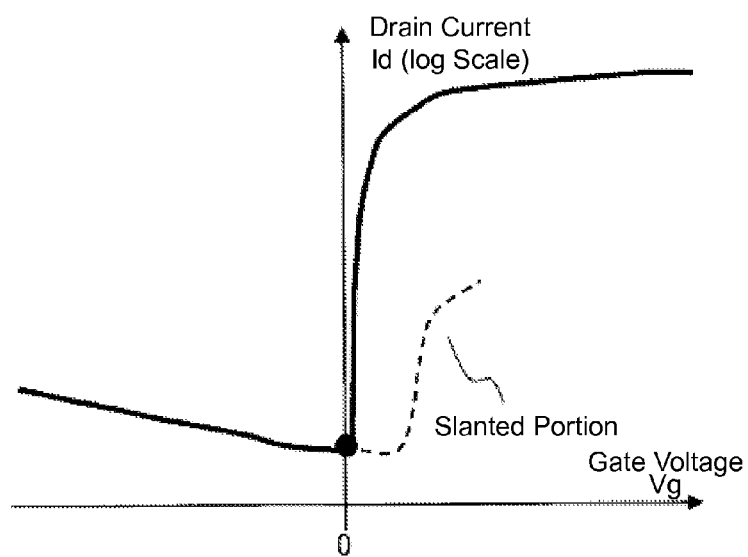
FIGS. 10(a) and 10(b) are graphs respectively showing examples of the voltage-current characteristics of an n-type TFT and a p-type TFT in a semiconductor device of an embodiment of the present invention.
Figure 10:
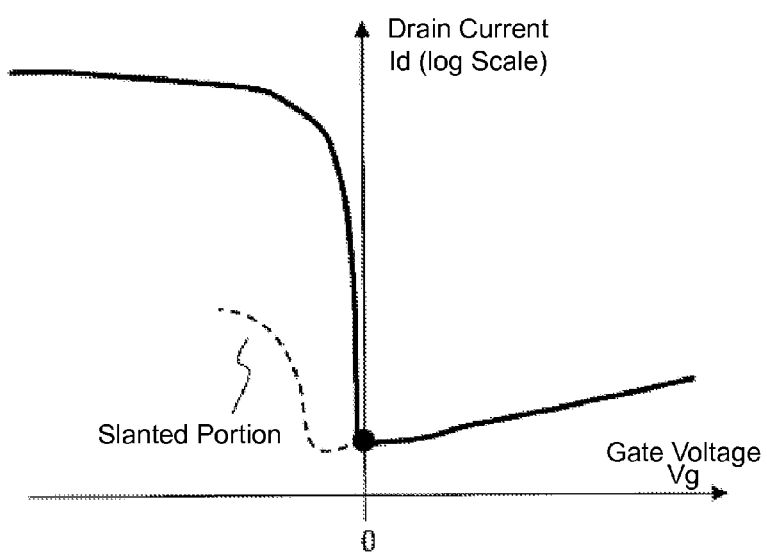

In this embodiment, in the n-type TFT 100, the slanted portion 11e is doped with the p-type impurity at a higher concentration than that in the main portion 11m. As a result, as shown in FIG. 10(a), it is possible to move the voltage-current characteristics of the parasitic transistor, which is formed in the slanted portion 11e, so as to overlap the voltage-current characteristics of the main portion 11m. On the other hand, in the p-type TFT 200, of the slanted portion 20e of the semiconductor layer 20, a portion in which a drain current possibly flows (a portion that is located at the edge of the channel region and that can operate as a parasitic transistor) has substantially the same p-type impurity concentration as that of the main portion 20m, for example. Therefore, as shown in FIG. 10(b), the voltage-current characteristics of the parasitic transistor that is formed in the slanted portion 20e are not shifted, and are masked by the voltage-current characteristics of the main portion 20m.

As a result, in both of the n-type and p-type TFTs, it is possible to suppress the effect of the characteristics of the slanted portions 11e and 20e (characteristics of parasitic transistors) to the TFT characteristics. Therefore, it becomes easier to turn off both TFTs when the gate voltage Vg is 0V. Also, by making an adjustment to the process conditions (impurity concentrations in the channel regions, the thickness of the gate insulating film, and the like), the driving voltages of these TFTs can be reduced.

Next, an overview of a method of manufacturing the semiconductor device shown in FIG. 1 will be explained.

Figure 1:
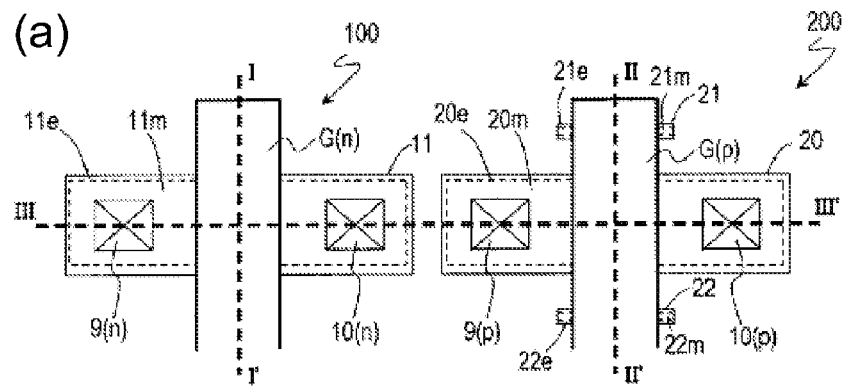
FIG. 1(a) is a plan view that schematically shows an n-type TFT and a p-type TFT in a semiconductor device according to Embodiment 1 of the present invention.
FIGS. 1(b) and 1(c) respectively show cross-sectional views along the line I-I' and the line II-II' in the plan view in FIG. 1(a).
FIG. 1(d) is a cross-sectional view along the line III-III' in the plan view in FIG. 1(a).
Figure 1:
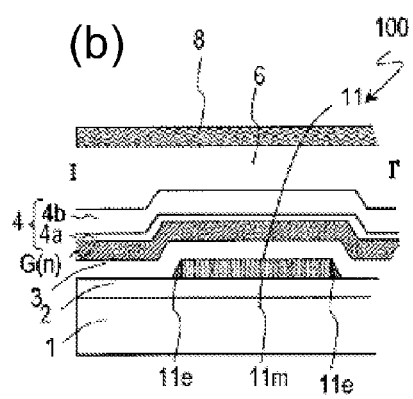
Figure 1:
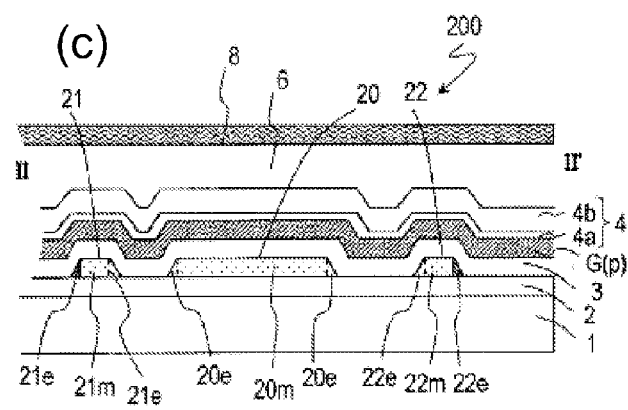
Figure 1:
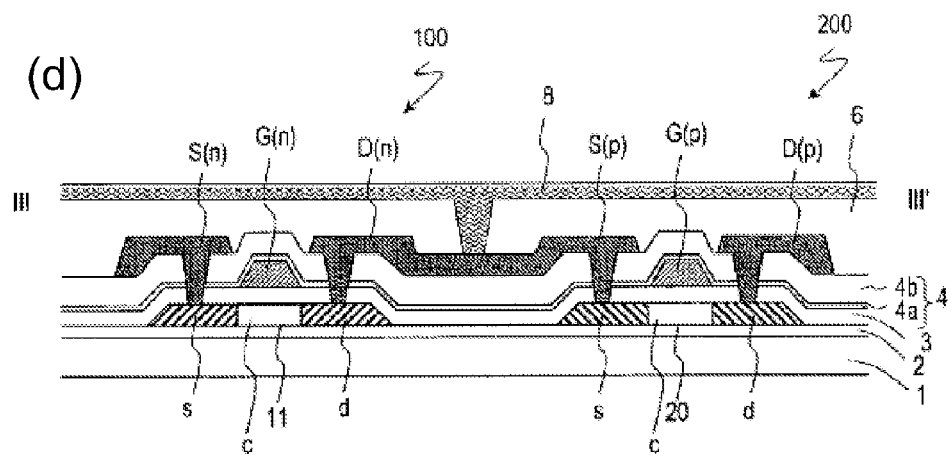

FIGS. 2 to 6 are schematic diagrams for illustrating an overview of a method of manufacturing the semiconductor device shown in FIG. 1. In each of the figures, (a) is a plan view, and (b) is a cross-sectional view along the line A-A' in the plan view in (a). The line A-A' is in parallel with the channel width direction. That is, in FIGS. 2 to 6, unlike the configuration shown in FIG. 1, the semiconductor layers of the n-type and p-type TFTs are arranged side by side in the channel width direction. There is no special limitation on the arrangement pattern of these TFTs, and it can be appropriately modified in accordance with a circuit configuration to be adopted and the like. Although FIGS. 2 to 6 respectively show a single n-type TFT and a single p-type TFT formed on the same substrate, the respective TFTs may be plurally formed on the same substrate.

First, see FIGS. 2(a) and 2(b). The base insulating film 2 is formed on a substrate, and on the base insulating film 2, a semiconductor film is deposited. On the semiconductor film, mask films (resist films, for example) 13 and 14 are formed. Thereafter, using the mask films 13 and 14 as masks, the semiconductor film is patterned. As a result, as shown in FIGS. 2(a) and 2(b), the semiconductor layer 11, which has a region where the channel region, the source region, and the drain region of the n-type TFT are to be formed, and a semiconductor layer 12, which has a region where the channel region, the source region, and the drain region of the p-type TFT are to be formed, are formed on the base insulating film 2. The semiconductor layers 11 and 12 respectively have the main portions 11m and 12m that are covered by the mask films 13 and 14, and the slanted portions 11e and 12e that are located at the peripheries of the main portions 11m and 12m and that are not covered by the mask films 13 and 14. In the examples shown in the figures, the upper surfaces of the main portions 11m and 12m are substantially flat, but it is also possible that the respective surfaces have recesses and protrusions, such as recesses and protrusions that the semiconductor film has before patterning, for example.

At this point, the semiconductor layer 11 has been patterned into a shape (final shape) that forms the channel region, the source region, and the drain region of the n-type TFT. On the other hand, the semiconductor layer 12 is patterned so as to be larger than a shape (final shape) that forms the channel region, the source region, and the drain region of the p-type TFT in a direction (W direction) that is perpendicular to the channel direction (L direction). Here, the semiconductor layer 12 is formed in a cross shape having portions thereof protruding in the W direction when viewed from the normal direction to the substrate.

Next, as shown in FIGS. 3(a) and 3(b), leaving the mask films 13 and 14 and using them as masks, the semiconductor layers 11 and 12 are doped with a p-type impurity (boron, for example) 15. In the semiconductor layers 11 and 12, the p-type impurity is not doped into the main portions 11m and 12m covered by the mask films 13 and 14, and is only doped into the slanted portions 11e and 12e selectively. Thereafter, the mask films 13 and 14 are removed.

Next, as shown in FIGS. 4(a) and 4(b), a mask film 19 is formed so as to cover the entire semiconductor layer 11, the region of the semiconductor layer 12 where the channel region, the source region, and the drain region are to be formed, and portions of the slanted portion 12e of the semiconductor layer 12, which extend in the channel direction (L direction), entirely. A mask region 19b of the mask film 19 is formed so as to cover the region where the channel region, the source region, and the drain region of the semiconductor layer 12 are to be formed. Mask regions 19a and 19c of the mask film 19 are formed so as to cover the portions 12et of the semiconductor layer 12. The portions 12et are part of the slanted portion 12e in the portions of the semiconductor layer 12 protruding in the W direction, and are extended in the channel direction. A mask region 19d of the mask film 19 is formed so as to cover the entire semiconductor layer 11. The mask film 19 has openings 19o and 19p located at two end portions of the region that becomes an active layer of the p-type TFT. As shown in FIG. 4(a), in the slanted portion 12e, portions thereof that are extended in the channel direction are entirely covered by the mask film 19.

Next, as shown in FIGS. 5(a) and 5(b), the semiconductor layer 12 is etched using the mask film 19 as a mask. In this etching, portions of the semiconductor layer 12 that are not covered by the mask film 19, i.e., the portions exposed in the openings 19o and 19p, are etched. As a result, the semiconductor layers 20, 21, and 22 are formed of the semiconductor layer 12. The semiconductor layer 20 has a region where the channel region, the source region, and the drain region are to be formed. The semiconductor layer 20 is formed between the semiconductor layer 21 and the semiconductor layer 22, and is not in direct contact with the semiconductor layer 21 or 22. This way, the semiconductor layers 20 to 22 that have been patterned into the final shapes are obtained. Thereafter, the mask film 19 is removed.

As shown in FIGS. 6(a) and 6(b), the gate insulating film 3 is formed so as to cover the semiconductor layer 11 and the semiconductor layers 20 to 22, and on the gate insulating film 3, the gate electrode 31 is formed so as to overlap the regions that become the channel regions of the semiconductor layers 11 and 20.

In the semiconductor layer 11 obtained in the manner described above, the entire slanted portion 11e formed in the periphery of the semiconductor layer 11 includes the p-type impurity at a higher concentration than that in the main portion 11m. In the slanted portion 20e of the semiconductor layer 20, portions thereof that overlap the gate electrode 31 formed above the semiconductor layer 20 includes the p-type impurity at substantially the same concentration as that of the main portion 20m. The slanted portion 21e of the semiconductor layer 21 on the side facing the semiconductor layer 20 includes the p-type impurity at substantially the same concentration as that in the main portion 20m of the semiconductor layer 20. The slanted portion 21e on the side opposite to the semiconductor layer 20 includes the p-type impurity at a higher concentration than that in the main portion 21m. Similarly, the slanted portion 22e of the semiconductor layer 22 on the side facing the semiconductor layer 20 includes the p-type impurity at substantially the same concentration as that of the main portion 20m of the semiconductor layer 20. The slanted portion 22e on the side opposite to the semiconductor layer 20 includes the p-type impurity at a higher concentration than that in the main portion 22m.

In the manner described above, the p-type impurity concentration of the slanted portion 11e of the semiconductor layer 11 can be made higher than the p-type impurity concentration of the main portion 11m of the semiconductor layer 11, the main portion 20m of the semiconductor layer 20, and part of the slanted portion 20e of the semiconductor layer 20 that overlaps the gate electrode. The base insulating film 2 between the semiconductor layer 11 and the semiconductor layer 20, for example, only undergoes the etching process described with reference to FIG. 2. That is, in contrast to the method described in the above-mentioned application where the base insulating film 2 between the semiconductor layer 11 and the semiconductor layer 20, for example, are etched twice, in the method according to this embodiment, the base insulating film 2 is etched only once. This makes it possible to minimize a step formed in a portion of the base insulating film 2 between the semiconductor layer 11 and the semiconductor layer 20, for example. Therefore, the size of a step on the surface of a base layer of the gate electrode, for example, that is formed on the base insulating film 2 (here, the surface of the gate insulating film 3) does not exceed the thickness of the semiconductor layer 20. As a result, the occurrence of defects such as disconnections of the gate electrode (wiring lines) can be reduced.

Part of the semiconductor layer 11 is doped with an n-type impurity, thereby forming the source and drain regions. Part of the semiconductor layer 20 is doped with a p-type impurity, thereby forming the source and drain regions. Thereafter, the source electrodes and the drain electrodes that are electrically connected to the source and drain regions, respectively, are disposed. This way, the n-type TFT 100 having the n-type semiconductor layer 11 and the p-type TFT 200 having the p-type semiconductor layer 20, which were shown in FIG. 1, are obtained.

It is preferable that the semiconductor layer 11 be further doped with a p-type impurity by a known method such that the p-type impurity concentration of the main portion 11m of the semiconductor layer 11 is made higher than the p-type impurity concentration of the main portion 20m of the semiconductor layer 20, but not exceeding the p-type impurity concentration of the slanted portion 11e of the semiconductor layer 11. This allows the voltage-current characteristics of the n-type TFT using the semiconductor layer 11 to be shifted to the higher voltage side, making it possible to ensure that the n-type TFT is turned off when the gate voltage Vg is 0V.

Below, with reference to figures, the method of manufacturing the semiconductor device of this embodiment will be explained more specifically. In the explanation below, steps that are generally performed in a process of fabricating a TFT such as activation annealing and hydrogenation are omitted.

FIGS. 7(a) to 7(f) are process cross-sectional views for explaining an example of the method of manufacturing the semiconductor device of this embodiment, respectively. These drawings show cross-sections along the channel width direction. FIGS. 7(g) to 7(l) are plan views corresponding to the line B-B' in FIGS. 7(a) to 7(f), respectively. The line B-B' is perpendicular to the channel direction.

First, as shown in FIG. 7(a), after depositing base films 102 and 103 on a substrate 101, a crystalline semiconductor film 104 is formed thereon. Next, on the crystalline semiconductor film 104, mask films (resist mask films) 105 and 106 are formed by photolithography. The mask film 105 is formed in an island shape, for example, and as shown in FIG. 7(g), the mask film 106 is formed in a cross shape, for example. The shapes and sizes of the mask films 105 and 106 are not limited to those shown in the figures.

A low-alkali glass substrate or a quartz substrate, for example, can be used as the substrate 101. A low-alkali glass substrate is used in this embodiment. The base films 102 and 103 can be made of a silicon oxide film, a silicon nitride film, a silicon oxide nitride film, or the like. In this embodiment, the base film 102 of the lower layer is made of a silicon nitride film, and the base film 103 of the upper layer is made of a silicon oxide film. These base films can be formed by the plasma CVD method, for example. In this embodiment, the base film has two layers, but it is also possible to form the base film of a single layer of a silicon oxide film, for example.

In this embodiment, a crystalline silicon film (20 to 150 nm thick, for example; preferably 30 to 80 nm thick) is formed as the crystalline semiconductor film 104. The crystalline silicon film is formed by depositing an amorphous silicon (a-Si) film on the base film 103, first, and after adding nickel (Ni) thereto, performing the solid phase crystallization (SPC). Alternatively, the crystalline silicon film may be formed by directly radiating excimer laser to the a-Si film for crystallization.

Next, as shown in FIG. 7(b), using the mask films 105 and 106 as masks, the crystalline semiconductor film 104 is etched into island shapes. This way, a semiconductor layer 112 that later becomes an active layer (source/drain regions, channel region) of the n-type TFT and a semiconductor layer 113 that later becomes an active layer of the p-type TFT are obtained. The semiconductor layer 113 is formed to be larger than the final shape of the semiconductor layer that becomes the active layer of the p-type TFT in the channel width direction. The semiconductor layer 113 is patterned so as to be larger than the semiconductor layer 112, for example, in the channel width direction. As shown in FIG. 7(h), the semiconductor layer 113 is formed in a cross shape, for example. The thickness of the semiconductor layers 112 and 113 is 50 nm, for example.

Next, in this state, as shown in FIGS. 7(c) and 7(i), a low concentration p-type impurity 109 is doped from above the mask films 105 and 106. Here, boron is used as the p-type impurity 109. As the injection conditions of the boron 109 in this doping, the acceleration voltage is set to 5 to 20 kV, and the dosage is set to $5 \times 10^{11}$ to $1 \times 10^{13}$ cm$^{-2}$, for example. This way, the p-type impurity 109 is implanted into the portions (slanted portions) 112e and 113e only, which are exposed from the mask films 105 and 106 in the semiconductor layers 112 and 113. The p-type impurity 109 is not implanted into portions (main portions) 112m and 113m that are covered by the mask films 105 and 106 in the semiconductor layers 112 and 113.

Thereafter, the mask films 105 and 106 are removed, and as shown in FIGS. 7(d) and 7(j), mask films 114a, 114b, 114c, and 114d are formed. The mask film 114a covers the entire semiconductor layer 112. The mask films 114b, 114c, and 114d are formed to have openings at the respective ends of the main portion 113m that becomes the active layer of the semiconductor layer 113 so as to expose end portions 113o. The mask film 114c covers the region that becomes the active layer of the semiconductor layer 113. The mask films 114b and 114*d* are formed on the semiconductor layer 113 so as to cover parts of the slanted portion 113*e*, which extend in the channel direction.

Figure 7:
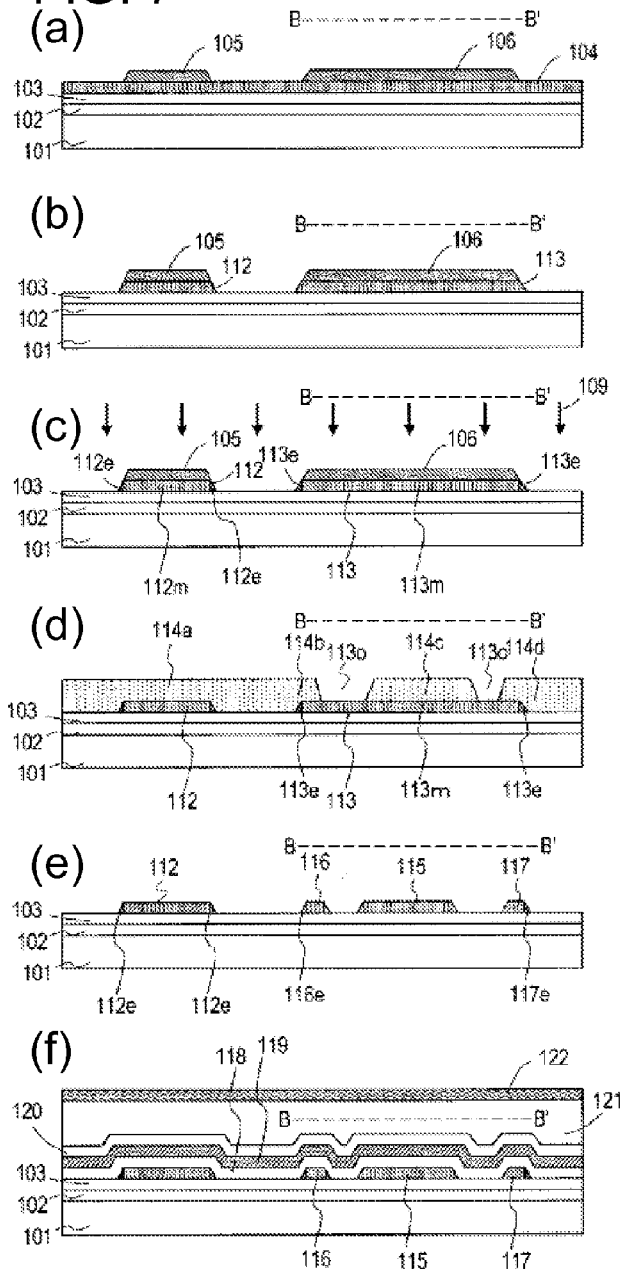
FIGS. 7(a) and 7(l) are process plan views and cross-sectional views that respectively illustrate an example of a method of manufacturing a semiconductor device of an embodiment of the present invention.
Figure 7:
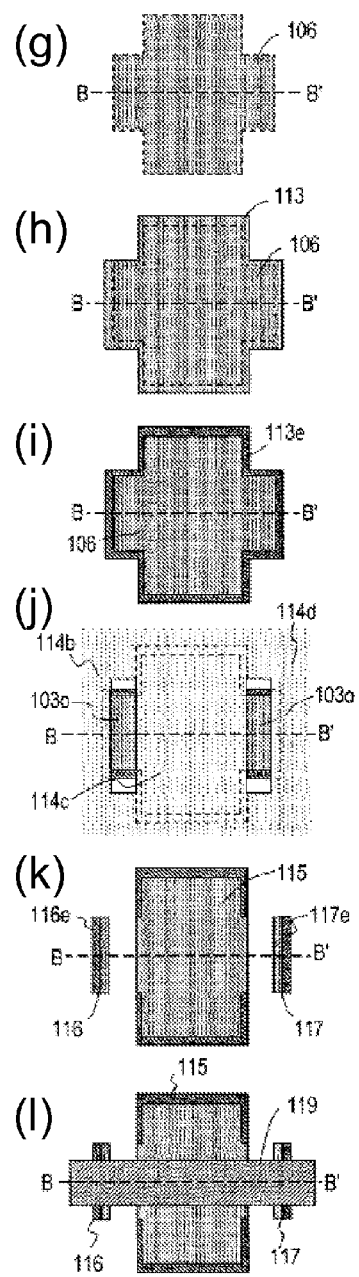

Next, as shown in FIGS. 7(*e*) and 7(*k*), the semiconductor layer 113 (see FIGS. 7(*d*) and 7(*j*)) is etched using the mask films 114*a* to 114*d* as masks, thereby forming a semiconductor layer 115 that becomes the active layer of the p-type TFT. In the slanted portion of the semiconductor layer 115, a portion thereof that can form a parasitic transistor (a portion that overlaps a gate wiring line 119, which will be later described) does not include a p-type impurity.

In this embodiment, the semiconductor layer 113 is etched by the RIE (Reactive Ion Etching) method using $CF_4$ gas and oxygen as etching gas, for example. In this etching process, a portion of the base insulating film 103 between the semiconductor layer 112 and the semiconductor layer 113, for example, is not etched. Therefore, in the portion of the base insulating film 103 between the semiconductor layer 112 and the semiconductor layer 113, a step is formed only as a result of the etching process described with reference to FIG. 7(*a*), and the step is not made larger. As a result, it is possible to prevent a step that is larger than the thickness of the semiconductor layer from being formed on the surface of the underlying layer of the gate wiring lines, thereby reducing the occurrence of defects such as disconnections of the gate wiring lines.

Next, the mask films 114*a* to 114*d* are removed.

In the manner described above, the semiconductor layer 112 and the semiconductor layer 115 in which the respective slanted portions have mutually different doping amounts can be obtained. Also, in the region where the p-type TFT is to be formed, the remaining semiconductor layer forms semiconductor layers 116 and 117. In the semiconductor layers 116 and 117, the respective slanted portions 116*e* and 117*e* on the sides facing the semiconductor layer 115 include the p-type impurity at substantially the same concentration as the main portion 112*m* of the semiconductor layer 112. The respective slanted portions 116*e* and 117*e* of the semiconductor layers 116 and 117 on the sides opposite to the semiconductor layer 115 include the p-type impurity at substantially the same concentration as the slanted portion 112*e* of the semiconductor layer 112. The slanted portion of the region that becomes the channel region of the semiconductor layer 115 has the p-type impurity at substantially the same concentration as the main portion 112*m* of the semiconductor layer 112.

Thereafter, as shown in FIGS. 7(*f*) and 7(*l*), a gate insulating film 118 and a gate electrode film 119 are formed on the semiconductor layers 112, 115, 116, and 117. Although not shown in this cross-sectional view, the source and drain regions of the semiconductor layer 112 are formed by doping the n-type impurity therein by a known method. Similarly, the source and drain regions of the semiconductor layer 115 are formed by doping the p-type impurity therein by a known method. Thereafter, on the gate electrode film 119, an interlayer insulating film 120 is formed. In this configuration, the interlayer insulating film has a multi-layer structure of a silicon nitride film in the lower layer and a silicon oxide film in the upper layer, for example.

Further, on the interlayer insulating film 120, source electrodes and drain electrodes of the respective TFTs are disposed. The source electrodes are connected to the source regions of the respective TFTs through contact holes formed in the interlayer insulating film 120 and the gate insulating film 118 (see FIG. 1(*d*), for example). Similarly, the drain electrodes are connected to the drain regions of the respective TFTs through contact holes formed in the interlayer insulating film 120 and the gate insulating film 118. This way, the n-type TFT and the p-type TFT are obtained.

Next, a resin layer 121 is formed so as to cover the n-type TFT and the p-type TFT. Also, in this embodiment, a pixel electrode film 122 is formed on the resin layer 121. The pixel electrode film 122 is electrically connected to the drain electrode of the n-type TFT and the source electrode of the p-type TFT through a contact hole formed in the resin layer 121.

In the process shown in FIG. 7, if necessary, in order to control the threshold voltages Vth of the n-type TFT and of the p-type TFT separately, channel-doping may be selectively performed to one of the semiconductor layers 112 and 115, or may be separately performed to the two semiconductor layers such that the concentrations of the p-type impurity in the main portions of these semiconductor layers 112 and 115 may be made to differ from each other.

Next, to explain other embodiments, modification examples of the method of manufacturing a semiconductor device that has been described with reference to FIGS. 2 to 6 will be described with reference to FIGS. 8 and 9.

Figure 8:
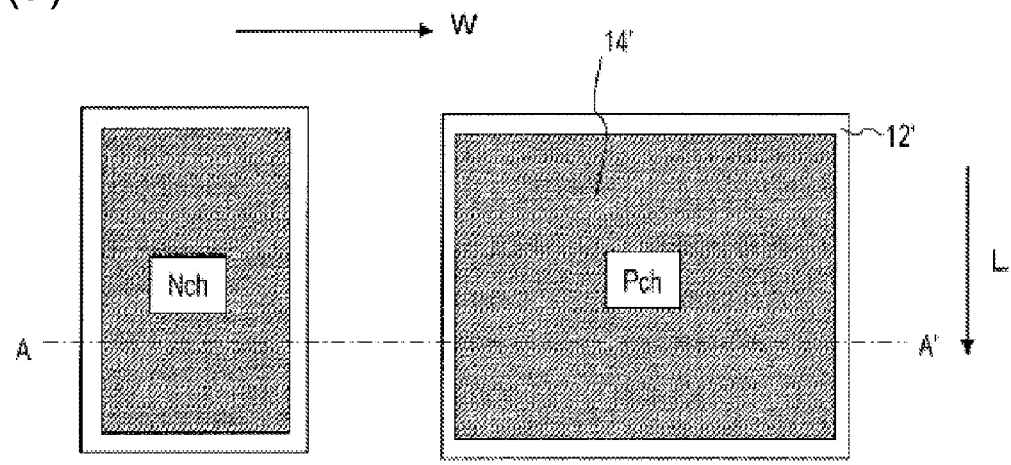
FIGS. 8(a) and 8(b) are a plan view and a cross-sectional view that schematically illustrate a method of manufacturing a semiconductor device of an embodiment of the present invention, respectively.
Figure 8:
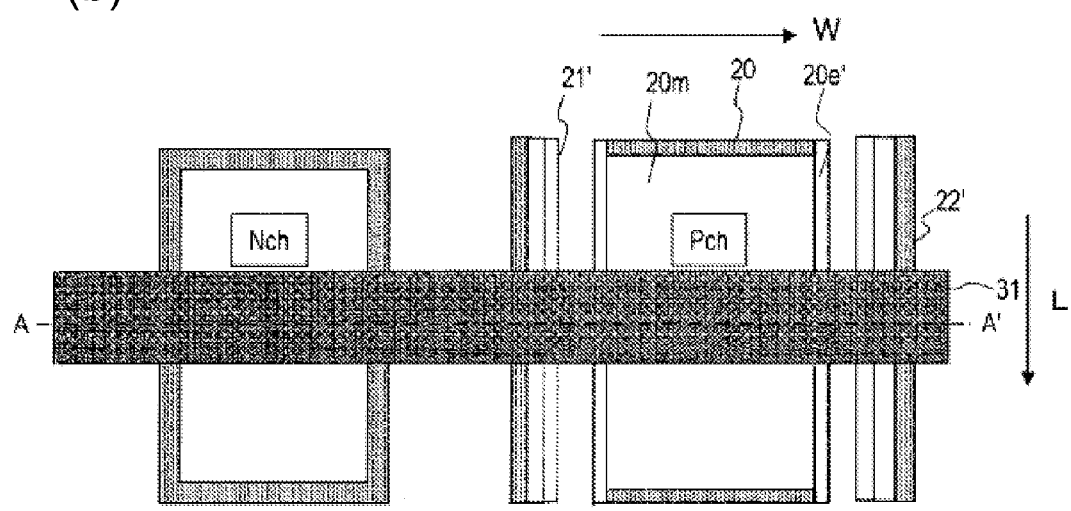
Figure 9:
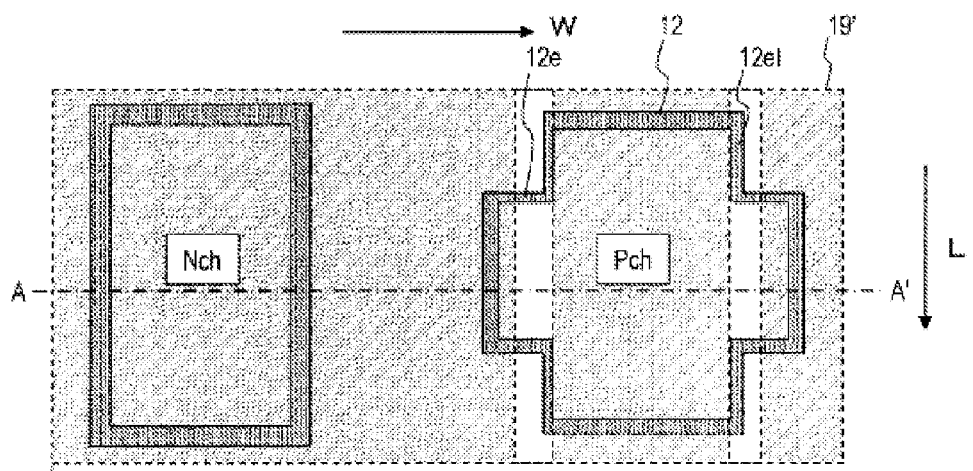
FIGS. 9(a) and 9(b) are a plan view and a cross-sectional view that schematically illustrate a method of manufacturing a semiconductor device of an embodiment of the present invention, respectively.
Figure 9:
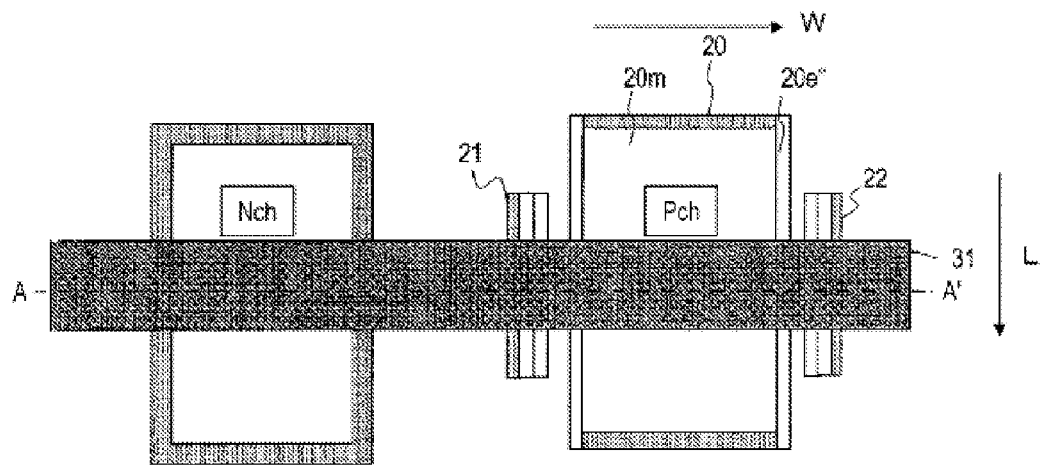

FIGS. 8 and 9 are schematic diagrams for illustrating an overview of a method of manufacturing a semiconductor device of other embodiments. In each of the figures, (a) and (b) are plan views, and the line A-A' is parallel to the channel width direction. In a manner similar to FIGS. 2 to 6, in FIGS. 8 and 9, the semiconductor layers of the n-type and p-type TFTs are arranged side by side along the channel width direction. There is no special limitation on the arrangement pattern of these TFTs, and it can be appropriately modified in accordance with a circuit configuration to be adopted and the like. Although FIGS. 8 and 9 respectively show a single n-type TFT and a single p-type TFT formed on the same substrate in a manner similar to FIGS. 2 to 6, the respective TFTs may be plurally formed on the same substrate.

Figure 2:
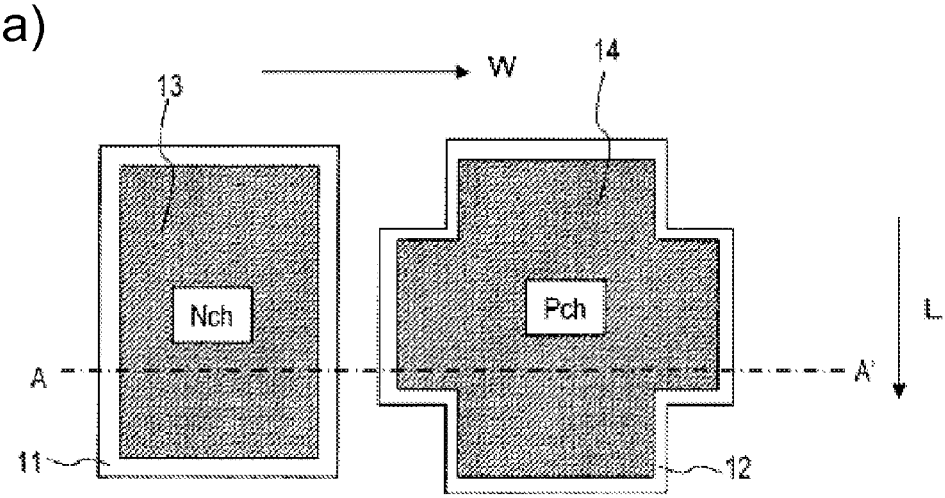
FIGS. 2(a) and 2(b) are a plan view and a cross-sectional view that schematically illustrate a method of manufacturing a semiconductor device of an embodiment of the present invention, respectively.
Figure 2:
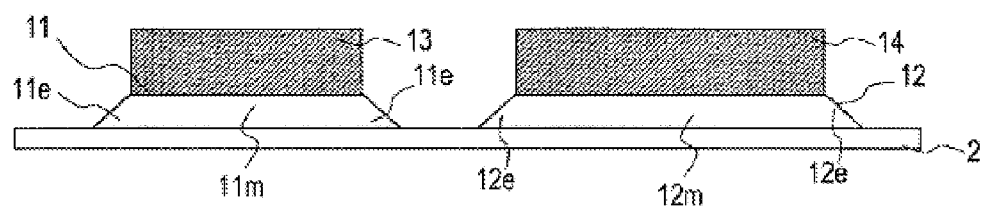
Figure 3:
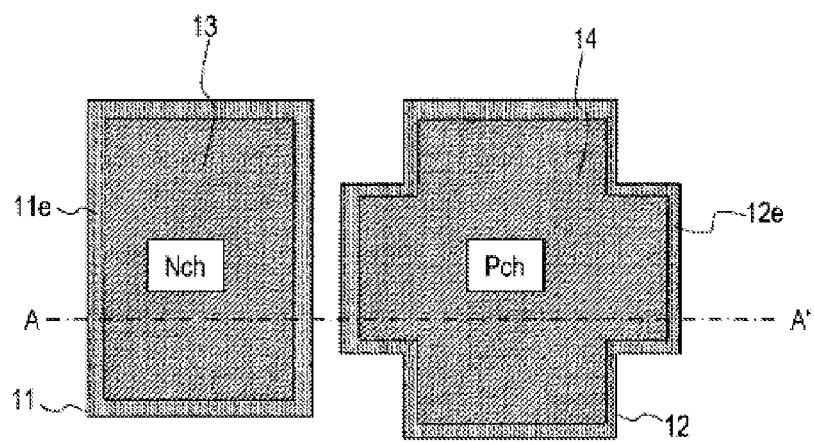
FIGS. 3(a) and 3(b) are a plan view and a cross-sectional view that schematically illustrate a method of manufacturing a semiconductor device of an embodiment of the present invention, respectively.
Figure 3:
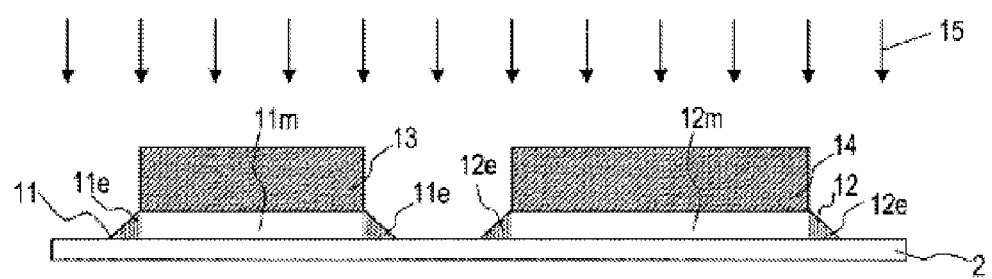

As shown in FIG. 8(*a*), instead of the cross-shaped semiconductor layer 12 shown in FIGS. 2(*a*) and 2(*b*), an island-shaped semiconductor layer 12' that is larger than the pattern (final shape) that forms the channel region, the source region, and the drain region of the p-type TFT in the W direction may be formed. A mask film 14' is formed in a shape that corresponds to the island-shaped semiconductor layer 12'.

Figure 4:
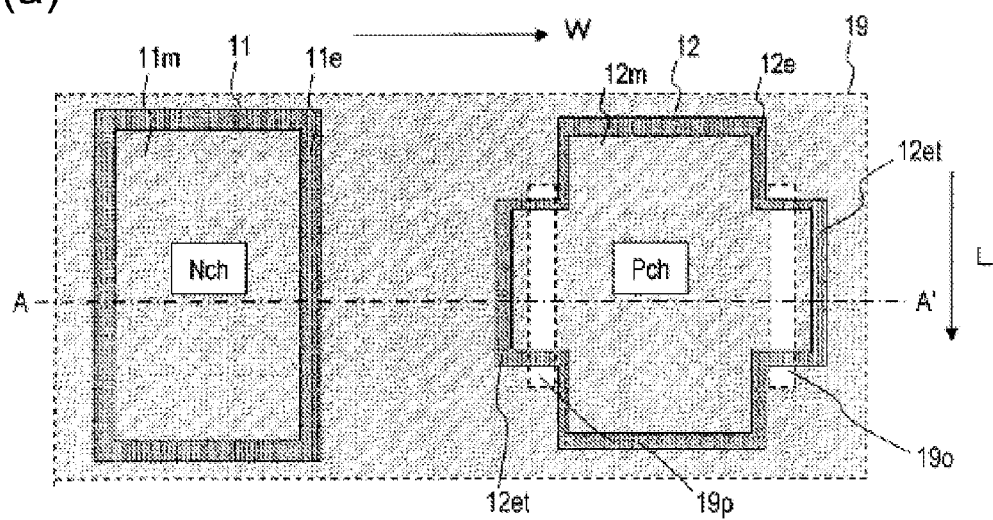
FIGS. 4(a) and 4(b) are a plan view and a cross-sectional view that schematically illustrate a method of manufacturing a semiconductor device of an embodiment of the present invention, respectively.
Figure 4:
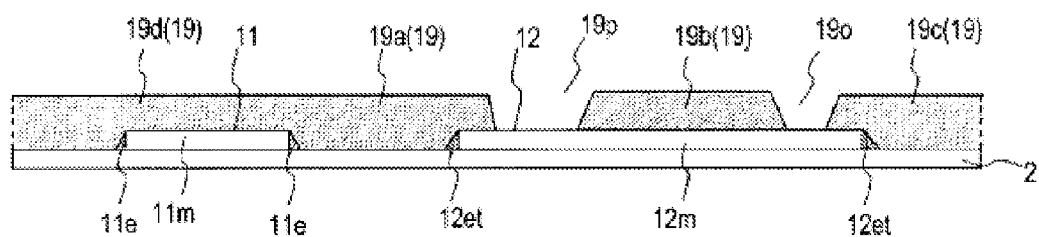
Figure 5:
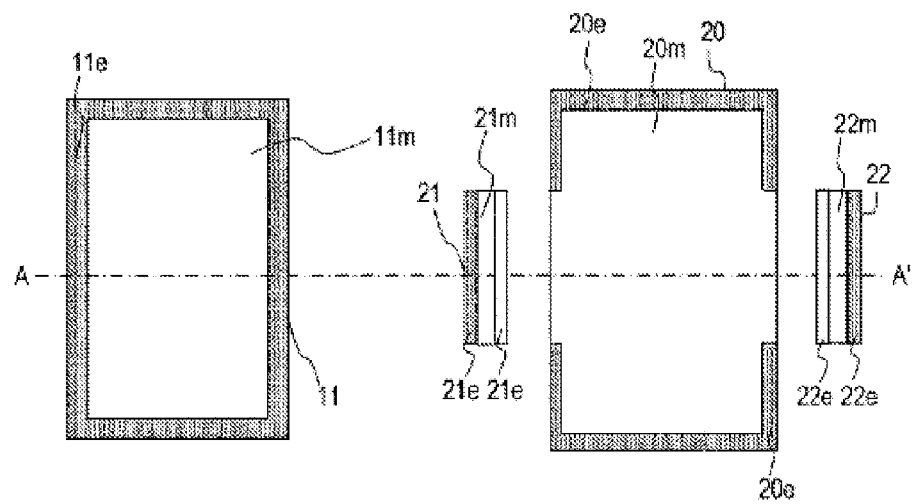
FIGS. 5(a) and 5(b) are a plan view and a cross-sectional view that schematically illustrate a method of manufacturing the semiconductor device of an embodiment of the present invention, respectively.
Figure 5:
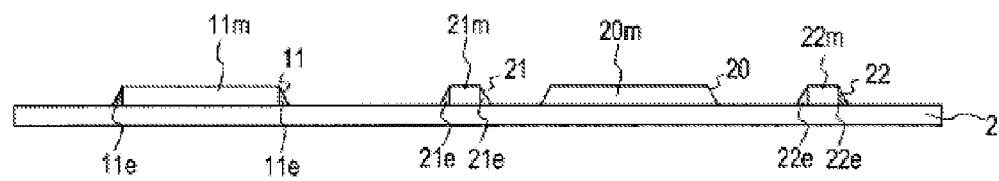
Figure 6:
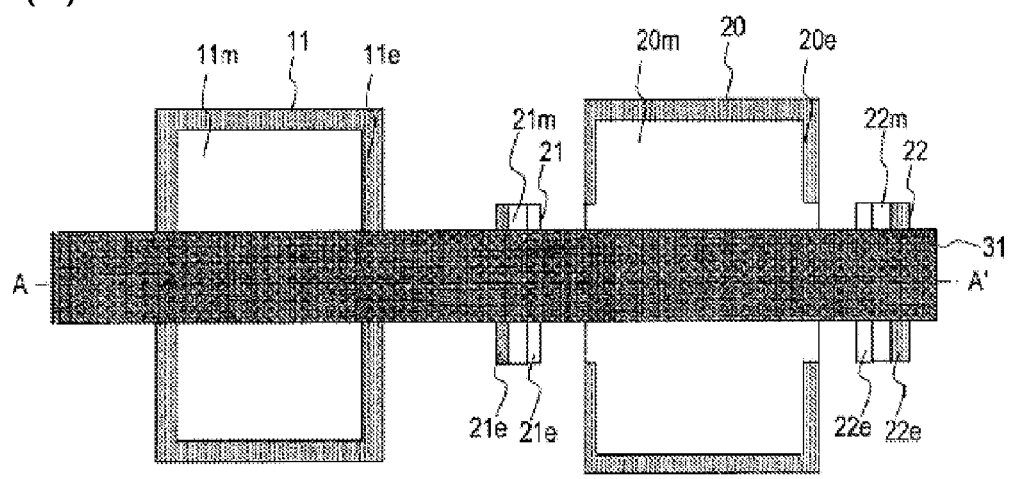
FIGS. 6(a) and 6(b) are a plan view and a cross-sectional view that schematically illustrate a method of manufacturing a semiconductor device of an embodiment of the present invention, respectively.
Figure 6:
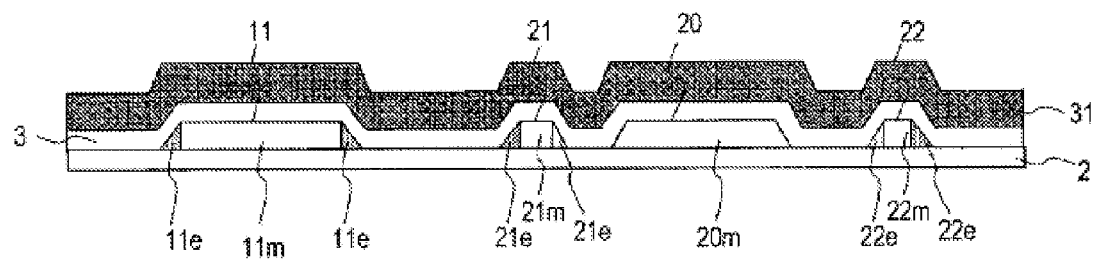

As shown in FIG. 9(*a*), instead of the mask film 19 shown in FIG. 4(*a*), a mask film 19' may be used. The mask film 19' is formed so as to expose portions 12*e*1 that are portions of the slanted portion 12*e*, which extend along the channel direction, in portions of the semiconductor layer 12 that are protruding in the L direction. The shape and size of the mask film 19' are not limited to the example shown in the figure.

Next, see FIGS. 8(*b*) and 9(*b*). The p-type impurity doped into the portion of the slanted portion 20*e* of the semiconductor layer 20 along the channel direction shown in FIGS. 6(*a*) and 6(*b*) may be set such that, as shown in FIGS. 8(*b*) and 9(*b*), the concentration of the p-type impurity in the portions 20*e*' and 20*e*'' extended along the channel direction of the slanted portion of the semiconductor layer 20 is the same as that of the main portion 20*m*. Further, as shown in FIG. 8(*b*), the semiconductor layers 21' and 22', which are separated from the semiconductor layer 20, may be formed such that the length thereof in the channel direction is the same as that of the semiconductor layer 20.

According to this embodiment, as described above with reference to FIG. 10, the hump that appears in the ON current upon driving up can also be eliminated in the voltage-current characteristics of the n-type TFT. As a result, the TFT can be turned off when the gate voltage Vg is 0V, and the threshold voltage Vth can be kept low.

According to the manufacturing method of this embodiment, by patterning the semiconductor film twice, the doping amounts of the slanted portions of the semiconductor layers can be made to differ from each other between the n-type TFT and the p-type TFT. Also, because a step is not formed in the base insulating film that lies below the gate wiring lines, the disconnections of the gate wiring lines can be prevented, making it possible to reduce the occurrence of the defects in TFTs.

Further, in a manner similar to the invention disclosed in the above-mentioned application, the gate insulating film 118 can be formed without any constraints from other processes, and therefore, it is possible to reduce the thickness of the gate insulating film 118 as compared with a conventional configuration. Also, because the thickness of the gate insulating film 118 can be selected with a higher degree of freedom, it is possible to obtain the thickness that is most suited to the device to be provided.

It is preferable that the thickness of the gate insulating film 118 do not exceed the thickness of the semiconductor layers 112 and 115 (30 nm to 80 nm, for example). It is preferable that the thickness of the gate insulating film 118 be set to 25 nm or more and 50 nm or less, for example. This makes it possible to effectively reduce the threshold voltages Vth of the respective TFTs, and as a result, the driving voltage of the semiconductor device can be further reduced.

Here, the magnitude relationship between the p-type impurity concentration of the semiconductor layer of the p-type TFT and that of the n-type TFT of this embodiment will be explained. In the following description, in the semiconductor layer of the n-type TFT, Cne is the p-type impurity concentration of a part of the slanted portion that can form a parasitic transistor, and Cnm is the p-type impurity concentration of the main portion. In the semiconductor layer of the p-type TFT, Cpe is the p-type impurity concentration of a part of the slanted portion that can form a parasitic transistor, and Cpm is the p-type impurity concentration of the main portion. Here, "the p-type impurity concentration of the main portion" refers to the p-type impurity concentration of the channel region of the main portion of the semiconductor layer (a region other than the source and drain regions). Also, "a part of the slanted portion that can form a parasitic transistor" refers to a part of the slanted portion located at an edge of the channel region, i.e., a part that overlaps the gate electrode.

In order to prevent the parasitic transistor of the n-type TFT from affecting the TFT characteristics as described above, the following equation needs to be fulfilled:

$$Cne > Cnm \quad (1).$$

In the n-type and p-type TFTs, the semiconductor layers may be doped with a p-type impurity (channel doping) so as to control the threshold voltage. However, in order to adjust the threshold voltage so as to ensure that both TFTs are turned off when the gate voltage Vg is 0V, it is preferable to fulfill the following:

$$Cnm > Cpm \quad (2).$$

Equations (1) and (2) can be summarized as follows:

$$Cne > Cnm > Cpm \quad (3).$$

Further, if the p-type impurity concentration of the slanted portion of the p-type TFT is too high, it would cause the parasitic transistor in the p-type TFT to have a greater effect to the TFT characteristics. In order to suppress this, it is preferable to fulfill the following:

$$Cpe < Cne \quad (4),$$

and it is more preferable to fulfill:

$$Cpe < Cpm \quad (5).$$

By adopting this embodiment, the threshold voltage Vth of the n-type TFT can be significantly reduced. In the conventional n-type TFT, when the thickness of the gate insulating film was 70 nm, the lower limit of the threshold voltage of the n-type TFT was 1.3V. In contrast, in this embodiment, by implanting the p-type impurity into the slanted portion of the n-type semiconductor layer, the lower limit of the threshold voltage Vth of the n-type TFT can be reduced to 0.8V, which is 0.5V lower than the conventional configuration. When the thickness of the gate insulating film 118 is 40 nm, the lower limit of the threshold voltage of the conventional n-type TFT was 0.9V, but in this embodiment, the lower limit of the threshold voltage Vth of the n-type TFT can be reduced to 0.5V.

Further, according to this embodiment, even if the thickness of the gate insulating film is reduced to 40 nm or smaller, for example, the reliability can be ensured.

The semiconductor device of this embodiment can be suitably used for a display device that is equipped with a memory circuit (image memory) in each pixel for storing display data. In the display device equipped with the image memories, the power consumption can be significantly reduced because the data transfer is not needed unless the display data changes. When the semiconductor device of this embodiment (SRAM circuit, DRAM circuit, or the like) is used as the image memory of such a display device, the power consumption of the display device can be further reduced. Specifically, it becomes possible to significantly reduce the panel driving voltage as compared with the conventional configuration (to less than 2V, for example). As a result, it becomes no longer necessary to provide a booster circuit, and the device can be driven by a button battery or the like (3V drive), for example. Such a display device can also be suitably used for applications that perform a constant display, for example.

Below, an example of a process of forming a semiconductor film (semiconductor film 104 in FIG. 7(a), for example) by a crystallization method using a catalytic element will be explained.

First, on the substrate, an amorphous semiconductor film (here, amorphous silicon film) is deposited by the plasma CVD method, for example.

Next, a catalytic element is added to at least part of the amorphous semiconductor film. The catalytic element may be one or a plurality of types of elements selected from nickel (Ni), iron (Fe), cobalt (Co), tin (Sn), lead (Pd), palladium (Pd), and copper (Cu). Although the catalytic effect is smaller than these elements, it is also possible to use ruthenium (Ru), rhodium (Rh), osmium (Os), iridium (Ir), platinum (Pt), gold (Au), or the like.

By a spin coating method, the amorphous semiconductor film is coated with aqueous solution (nickel acetate solution) that contains a catalytic element (nickel, for example) of 5 ppm by weight, for example. The amount of the catalytic element added herein is very small. The catalytic element concentration on the surface of the amorphous semiconductor film is about $5 \times 10^{12}$ atoms/cm$^2$, for example, when measured by the total reflection X-ray fluorescence (TRXRF) analysis method.

It is also possible to deposit a thin film that contains the catalytic element (nickel film, in this embodiment) on the amorphous semiconductor film by vapor deposition, sputtering, or the like, instead of the spin coating method.

Next, under an inert atmosphere such as a nitrogen atmosphere, the amorphous semiconductor film containing the catalytic element undergoes heat treatment. As the heat treatment, it is preferable to perform an annealing process for a period of 30 minutes to four hours at a temperature ranging from 550 to 620° C., for example. The heat treatment can be performed using a furnace, or using an RTA (Rapid Thermal Annealing) apparatus that uses a lamp or the like as a heat source.

In the heat treatment, nickel that is present on the surface of the amorphous semiconductor film is diffused through the amorphous semiconductor film, forming silicides. Using the silicides as nuclei, the amorphous semiconductor film is crystallized. As a result, a crystalline semiconductor film (here, a crystalline silicon film) that includes a crystalline region is made from the amorphous semiconductor film. As long as the crystalline semiconductor film includes a crystalline region, a part of the crystalline semiconductor film may be left in an amorphous state.

It is also possible to re-crystalize the crystalline semiconductor film obtained in the manner described above by radiating a laser beam thereto, thereby further improving the crystallinity. In the laser irradiation, XeCl excimer laser (wavelength 308 nm) or KrF excimer laser (wavelength 248 nm) can be used.

Thereafter, by using the semiconductor film formed in the manner described above, the semiconductor layers of the n-type and p-type TFTs are formed by the method described with reference to FIG. 7.

It is preferable to perform heat treatment, i.e., gettering, before or after the semiconductor film is patterned so as to move the catalytic element that is present in the regions that become at least the channel regions of the respective semiconductor layers to other regions (gettering region). The gettering region can be formed by doping a part of the semiconductor film with an element that belongs to Group 5B of the periodic table (phosphorus, for example), which has an effect of moving the catalytic element, for example. The heat treatment for gettering is performed for a period of 30 seconds to 20 minutes at a temperature ranging from 600 to 750° C., for example.

It is also possible to perform a heat treatment after doping an impurity element into the source and drain regions and the like of the semiconductor layers to activate the impurity element and perform the gettering for the catalytic element.

The semiconductor layer formed by the above-mentioned crystallization method includes a catalytic element. Also, in the semiconductor layer, at least the channel region thereof is mainly constituted of crystals of the <111> zone. The reason for this will be explained below.

Generally, when an amorphous semiconductor film is crystallized without using a catalytic element, because of an effect of an insulating film lying under the semiconductor film (in the case of using an amorphous silicon dioxide, in particular), crystals in the crystalline semiconductor film are likely to have (111) plane orientation. On the other hand, when an amorphous semiconductor film that includes a catalytic element is crystallized as in the method above, the semiconductor compound of the catalytic element becomes a driving force of the crystal growth, and adjacent amorphous regions are crystallized one after another toward the same direction. Because the catalytic element compound tends to grow more rapidly in the <111> direction, the <111> zone appears.

According to the method above, 50% or more of the region in which the plane orientation of the crystals of the semiconductor layer is defined by the <111> zone has (110) or (211) plane orientation. Further, the size (domain size) of each crystal domain (region with the substantially same plane direction) is 2 μm to 10 μm, for example. The plane orientation, the ratio of the plane orientation, and the domain size of the crystal domains were measured by the EBSP (Electron Back Scattering Pattern) method.

Below, a semiconductor device of another embodiment of the present invention will be explained. This embodiment is an active matrix type liquid crystal display device. In the liquid crystal display device of this embodiment, a driver circuit that includes n-type TFT and p-type TFT is formed integrally with an active matrix substrate (driver monolithic).

Figure 11:
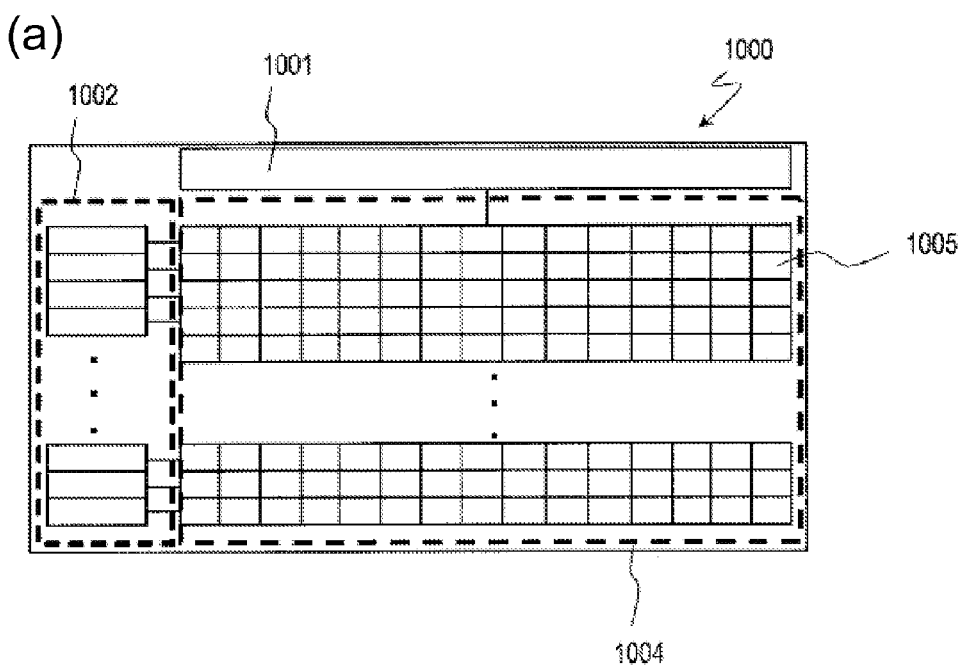
FIG. 11(a) is a schematic plan view of an active matrix substrate 1000 in which a driver circuit is integrally formed.
FIG. 11(b) is a diagram schematically showing a configuration of one pixel.
FIG. 11(c) is a diagram showing an example of a circuit that uses CMOS (NAND circuit).
Figure 11:
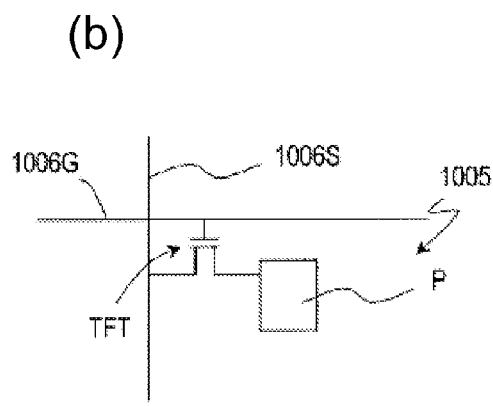
Figure 11:
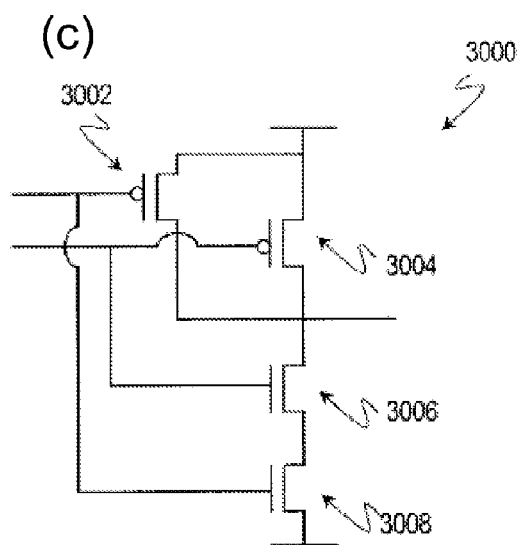

FIG. 11(a) is a schematic plan view showing an active matrix substrate 1000 in the liquid crystal display panel of this embodiment. FIG. 11(b) schematically shows a structure of a single pixel. In FIG. 11(a), a structure of the active matrix substrate 1000 is shown, and a liquid crystal layer and an opposite substrate are omitted. A liquid crystal display device can be obtained by providing a backlight, a power source, and the like to a liquid crystal display panel formed by using this active matrix substrate 1000.

The active matrix substrate 1000 has a frame region where a gate driver 1002 and a source driver 1001 are disposed and a display region 1004 where a plurality of pixels are arranged. The reference character 1005 represents regions corresponding to respective pixels in the active matrix substrate 1000. The source driver 1001 does not necessarily have to be formed in the active matrix substrate 1000 integrally, and a source driver IC or the like that is separately fabricated may be mounted by a known method.

As shown in FIG. 11(b), the active matrix substrate 1000 has pixel electrodes P, each of which corresponds to a single pixel in the liquid crystal display panel. The pixel electrode P is connected to a source bus line 1006S through a TFT for pixel switching. The gate electrode of the TFT is connected to a gate bus line 1006G.

The gate bus lines 1006G are connected to outputs of the gate driver 1002, respectively, and are scanned in a line-sequential manner. The source bus lines 1006S are connected to outputs of the source driver 1001, and are supplied with display signal voltages (gradation voltages).

The source driver 1001 and the gate driver 1002 are provided with a plurality of CMOS for high-speed driving. At least one of the gate driver 1002 and the source driver 1001 may be provided with a shift register that is constituted of CMOS, for example. In this embodiment, at least one of these CMOS includes an n-type TFT and a p-type TFT that have the same configurations as those in the above embodiments.

As an example of a circuit that uses CMOS, an NAND circuit is shown in FIG. 11(c). The TFTs described in one of the embodiments above can be used as p-type TFTs 3002 and 3004 and n-type TFTs 3006 and 3008 that are used in an NAND circuit 3000.

The semiconductor device of this embodiment may be a liquid crystal display device having a memory circuit provided for each pixel. In such a liquid crystal display device, each pixel is provided with a switching transistor, a pixel electrode, a memory circuit that stores an image signal inputted to the pixel electrode through the switching transistor, and a liquid crystal cell that is driven to perform display in accordance with the inputted image signal. The signal voltage that is stored in the memory circuit is constantly applied to the liquid crystal cell of that pixel. Therefore, as long as the same still image is to be displayed, the display on the screen can be maintained using the signal voltage stored in the memory circuit, and it is not necessary to input an image signal to the display device from the outside.

Figure 12:
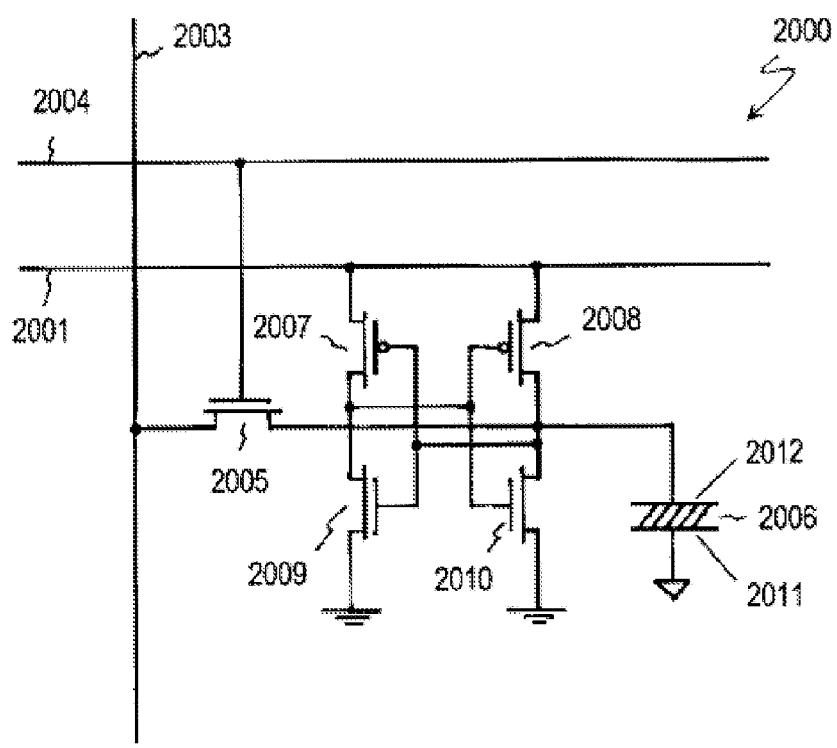
FIG. 12 shows an example of a circuit of each pixel 2000 in a display device that includes a memory circuit in each pixel.
Figure 13:
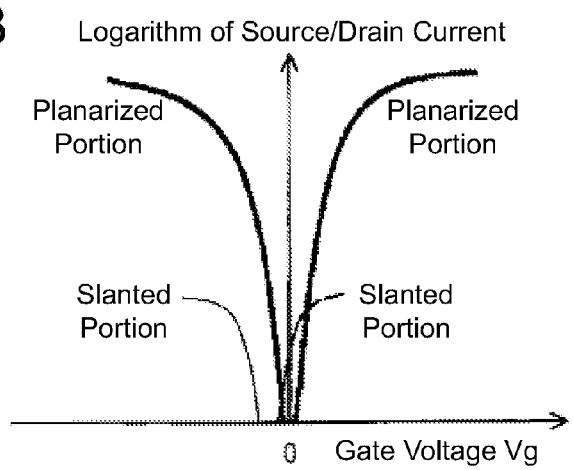
FIG. 13 is a graph that shows an example of the voltage-current curves of an n-type TFT and a p-type TFT.
Figure 14:
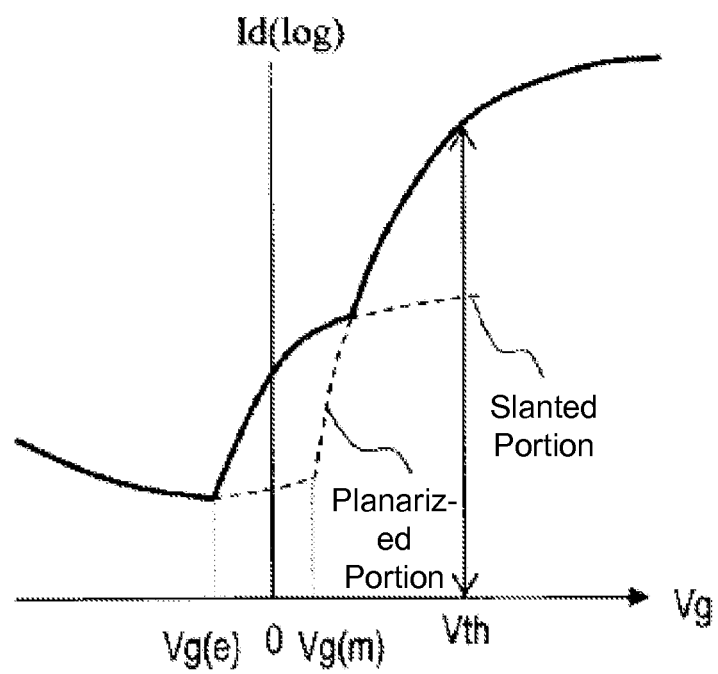
FIGS. 14(a) and 14(b) are graphs respectively showing examples of voltage-current characteristics of conventional n-type TFT and p-type TFT.
Figure 14:
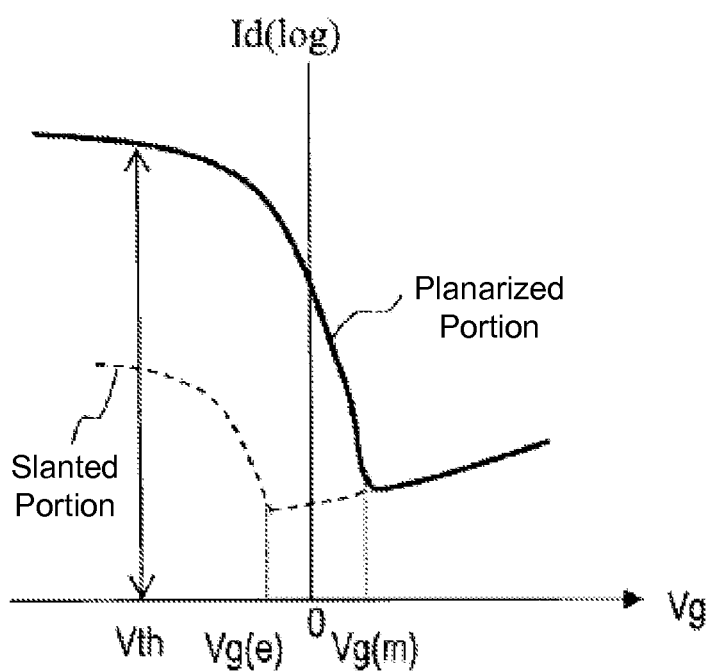
Figure 15:
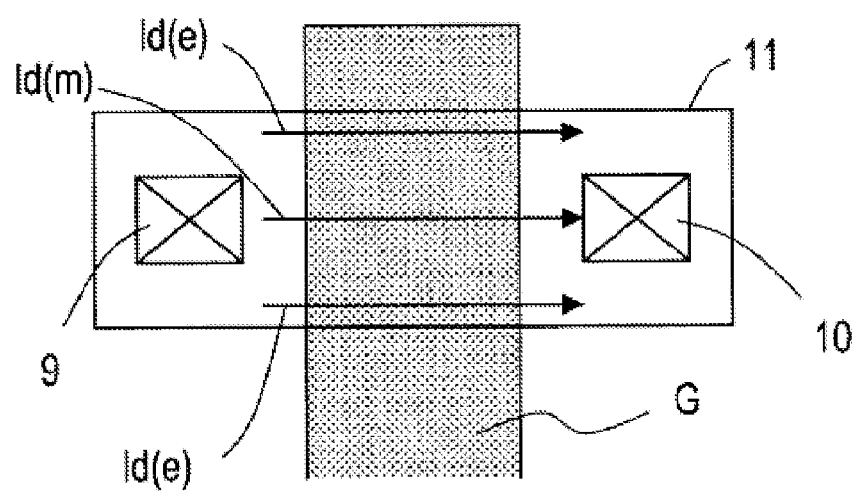
FIG. 15 is a plan view of a semiconductor layer of an n-type TFT.
Figure 16:
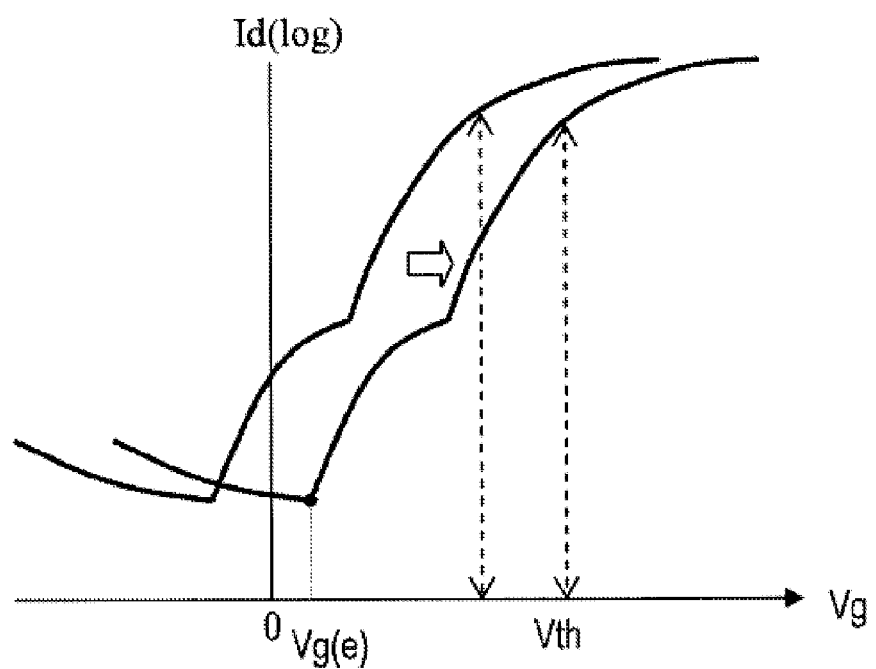
FIG. 16 is a diagram for illustrating an adjustment made to a threshold voltage Vth in a conventional n-type TFT.
Figure 17:
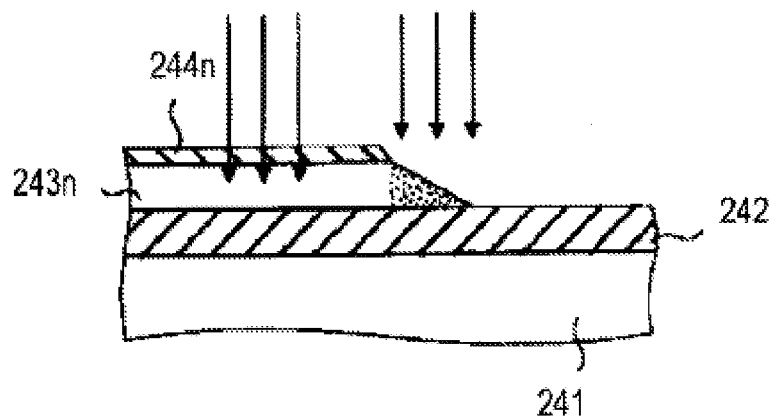
FIGS. 17(a) and 17(b) are cross-sectional views respectively showing a method of manufacturing an n-type TFT and a p-type TFT, which is disclosed in Patent Document 1.
Figure 17:
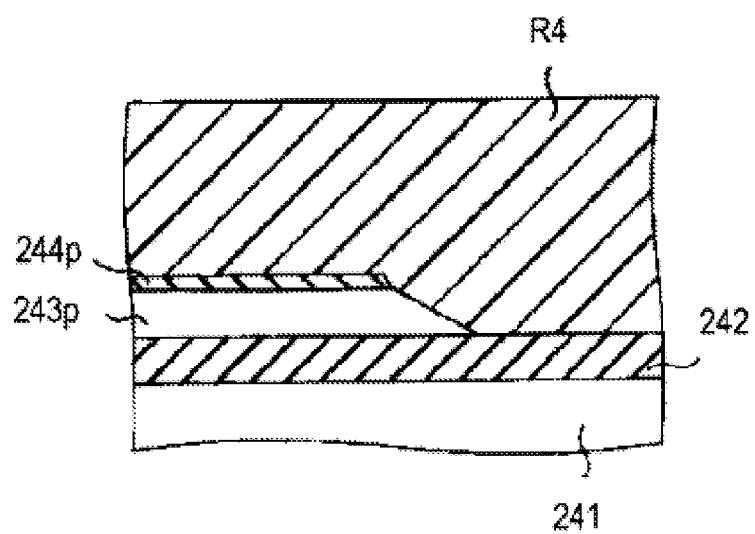
Figure 18:
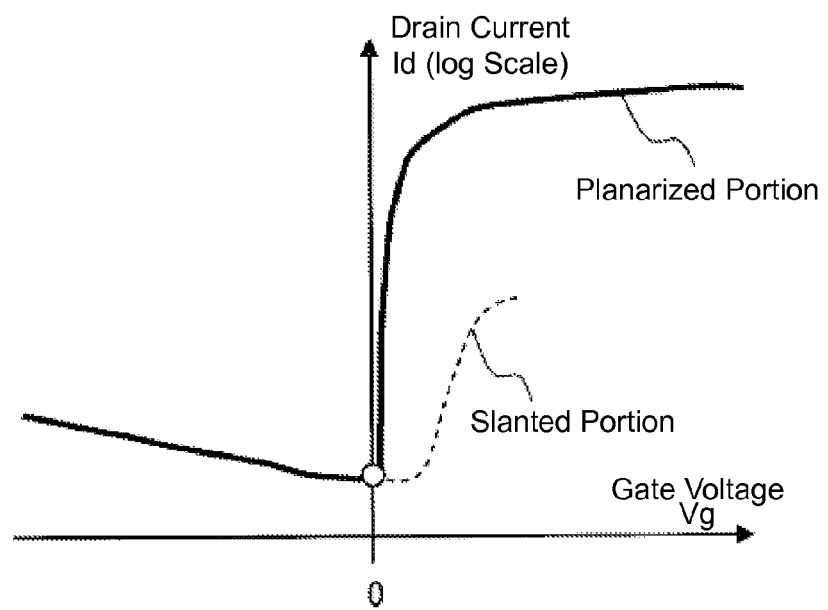
FIGS. 18(a) and 18(b) are graphs respectively showing examples of voltage-current characteristics of n-type TFT and p-type TFT in the case where slanted portions of respective semiconductor layers are doped with a p-type impurity at a higher concentration than that in planarized portions thereof.
Figure 18:
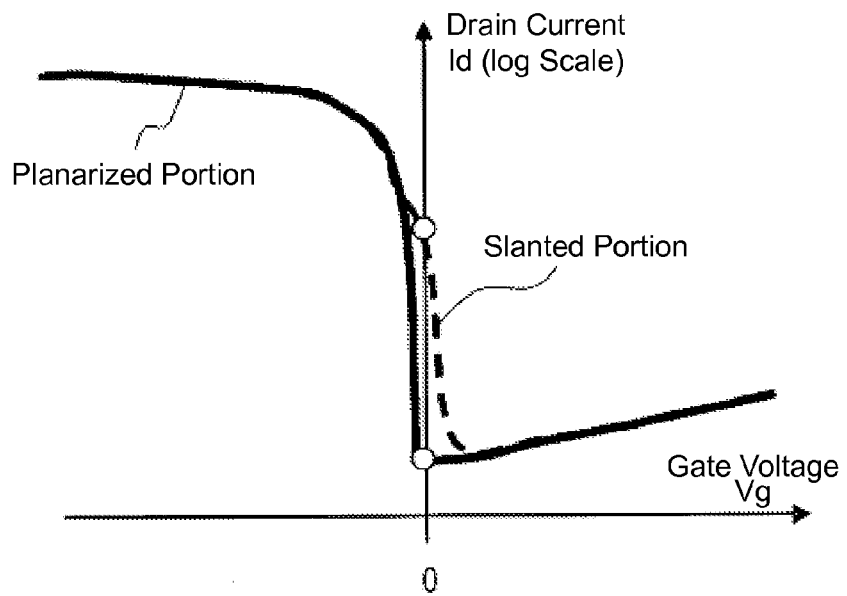

FIG. 12 is an example of a circuit of each pixel 2000 in the semiconductor device of this embodiment.

Each pixel 2000 in the semiconductor device of this embodiment is provided with an n-type transistor 2005 that is connected to a source bus line 2003 and a gate bus line 2004 and a memory circuit that stores an image signal inputted to this pixel through the transistor 2005. The memory circuit is an SRAM circuit that is constituted of p-type transistors 2007 and 2008 and n-type transistors 2009 and 2010. The p-type transistor 2007 and the n-type transistor 2009 included in the SRAM circuit are arranged adjacently to each other, and have the same configurations as those in one of the embodiments above. Similarly, the p-type transistor 2008 and the n-type transistor 2010 are arranged adjacently to each other, and have the same configurations as those in one of the embodiments above.

In the transistor 2005, the gate terminal is connected to the gate bus line 2004 of the liquid crystal display device, the drain terminal is connected to the source bus line 2003 of the liquid crystal display device, and the source terminal is connected to the memory circuit. Wiring 2001 is a power supply line of the memory circuit, and is set to a voltage value that is to be charged to a liquid crystal 2006.

A signal voltage supplied from the source bus line 2003 is applied to an electrode 2012 provided for the liquid crystal 2006, and the liquid crystal 2006 is applied with an electric field that corresponds to a potential difference between the electrode 2012 and an opposite electrode 2011.

Next, an operation of the circuit shown in FIG. 12 will be explained. For a period of 1/(30×number of scanning lines) seconds or 1/(60×number of scanning lines) seconds, a voltage pulse is applied to the gate bus line 2004, which turns the transistor 2005 on. During that period, an image signal from the source bus line 2003 is charged to the liquid crystal 2006 and the gate of the transistor 2009. If the image signal is ON voltage (high voltage), an electric field is applied to the liquid crystal 2006, which changes the orientation thereof. Also, the transistor 2009 is turned on, and the transistor 2010 is turned off. When the voltage of the gate bus line 2004 becomes OFF voltage (low voltage), the transistor 2005 is turned off. However, because the liquid crystal 2006 is charged through the transistor 2008, the orientation thereof does not change. When OFF voltage (low voltage) is inputted from the source bus line 2003 during a period in which the transistor 2005 is in the ON state, an electric field is not applied to the liquid crystal 2006, the transistor 2009 is turned off, and the transistor 2010 is turned on. Even after the transistor 2005 was turned off, because the liquid crystal 2006 discharges an electrical current through the transistor 2010 in the ON state, the electric field is not applied.

In the example shown in FIG. 12, the SRAM circuit having a simple configuration is used as the memory circuit, but the configuration of the SRAM circuit is not limited to such. In the example shown in the figure, the SRAM circuit includes four TFTs, but a greater number of TFTs may be provided. It is also possible to use a DRAM circuit instead of the SRAM circuit.

INDUSTRIAL APPLICABILITY

The application range of the present invention is very broad, and it is possible to apply the present invention to semiconductor devices equipped with n-type TFTs and p-type TFTs and to electronic devices in all fields for which such semiconductor devices are used. For example, a CMOS circuit that is formed by implementing the present invention can be used for a peripheral circuit of a display device such as an active matrix liquid crystal display device or an organic EL display device. The present invention can also be suitably used for a display device that has a memory circuit provided for each pixel.

Such a display device can be used for a display screen of a mobile phone or a portable gaming device, a monitor of a digital camera, or the like, for example. Therefore, the present invention can be used for any electronic device that has a liquid crystal display device or an organic EL display device incorporated therein.

DESCRIPTIONS OF REFERENCE CHARACTERS 1 substrate
2 base insulating film
3 gate insulating film
4 interlayer insulating film
6 protective film
8 pixel electrode film
9($n$), 9($p$), 10($n$), 10($p$) contact portion
11 semiconductor layer of n-type TFT
20 semiconductor layer of p-type TFT
21, 22 semiconductor layer
11$e$, 20$e$, 21$e$, 22$e$ slanted portion of semiconductor layer
11$m$, 20$m$, 21$m$, 22$m$ main portion of semiconductor layer
100 n-type TFT
200 p-type TFT
G(n), G(p) gate electrode
S(n), S(p) source electrode
D(n), D(p) drain electrode

The invention claimed is:
1. A semiconductor device, comprising:
a first thin film transistor of n-channel type and a second thin film transistor of p-channel type formed on a single substrate; and
an insulating film on which the first and second thin film transistors are formed,
wherein the first thin film transistor comprises: a first semiconductor layer that has a channel region, a source region, and a drain region; a gate electrode disposed so as to overlap the channel region; and a gate insulating film interposed between the first semiconductor layer and the gate electrode,
wherein the second thin film transistor comprises: a second semiconductor layer that has a channel region, a source region, and a drain region; a third semiconductor layer and a fourth semiconductor layer that are disposed at opposite sides of the second semiconductor layer; a gate electrode disposed so as to overlap the channel region and the third and fourth semiconductor layers; and a gate insulating film interposed between the second semiconductor layer and the gate electrode,
wherein the first, second, third, and fourth semiconductor layers are formed of a same film,
wherein the first and second semiconductor layers respectively have slanted portions located on peripheries and main portions that are made of portions other than the slanted portions,
wherein the slanted portion of the channel region of the first semiconductor layer is doped with a p-type impurity at a higher concentration than that in the main portion of the first semiconductor layer and the main portion of the second semiconductor layer, and
wherein the slanted portion of the channel region of the second semiconductor layer is doped with the p-type impurity at a lower concentration than that of the slanted portion of the channel region of the first semiconductor layer.

2. The semiconductor device according to claim 1, wherein a step formed on a surface of a base film lying under the gate electrode is not larger than a thickness of the second semiconductor layer.

3. The semiconductor device according to claim 1, wherein the concentration of the p-type impurity in the main portion of the second semiconductor layer is lower than the concentration of the p-type impurity in the main portion of the first semiconductor layer.

4. The semiconductor device according to claim 1, wherein the third and fourth semiconductor layers respectively have slanted portions that extend along a channel direction when viewed from a normal direction to a plane of the single substrate, and wherein, of the slanted portions, portions that are located on respective sides that are opposite to the second semiconductor layer are doped with the p-type impurity at a higher concentration than that in the slanted portion of the channel region of the second semiconductor layer.

5. The semiconductor device according to claim 1, wherein the gate insulating film is formed so as not to be thicker than the first and second semiconductor layers.

6. The semiconductor device according to claim 1, wherein a thickness of the gate insulating film is 50 nm or less.

7. The semiconductor device according to claim 1, wherein the first, second, third, and fourth semiconductor layers include a catalytic element that facilitates crystallization of an amorphous semiconductor film.

8. The semiconductor device according to claim 7, wherein the catalytic element includes one or a plurality of types of elements selected from Ni, Co, Sn, Pb, Pd, Fe, and Cu.

9. The semiconductor device according to claim 1, further comprising an SRAM circuit, wherein the SRAM circuit has the first thin film transistor and the second thin film transistor.

10. A display device, comprising:
the semiconductor device according to claim 9 and a plurality of pixels,
wherein each of the pixels includes:
a pixel electrode;
a memory circuit that is connected to the pixel electrode and that stores an image signal; and
a display cell that performs display based on the image signal, and
wherein the memory circuit comprises the SRAM circuit.

11. A method of manufacturing a semiconductor device that includes a first thin film transistor of n-channel type and a second thin film transistor of p-channel type on a single substrate, the method comprising:
(a) forming an insulating film on the substrate;
(b) forming a semiconductor film on the insulating film;
(c) forming a first mask film and a second mask film on the semiconductor film;
(d) etching the semiconductor film by using the first and second mask films as masks to form a first semiconductor layer that includes a region where a channel region, a source region, and a drain region of the first thin film transistor are to be formed, and to form a semiconductor layer that includes a region where a channel region, a source region, and a drain region of the second thin film transistor are to be formed, the first semiconductor layer including a main portion that is covered by the first mask film and a slanted portion that is located in a periphery of the first semiconductor layer and that is not covered by the first mask film, the semiconductor layer including a main portion that is covered by the second mask film and a slanted portion that is located in a periphery of the semiconductor layer and that is not covered by the second mask film;
(e) doping a p-type impurity into the slanted portion of the first semiconductor layer and the slanted portion of the semiconductor layer using the first and second mask films as masks;
(f) removing the first and second mask films;
(g) forming a third mask film that entirely covers the first semiconductor layer and a fourth mask film that covers the region of the semiconductor layer where the channel region, the source region, and the drain region are to be formed and a part of the slanted portion of the semiconductor layer, which extends along a channel direction;
(h) etching the semiconductor layer using the third and fourth mask films as masks to divide the semiconductor layer into a second semiconductor layer that has a region where the channel region, the source region, and the drain region are to be formed and into a third semiconductor layer and a fourth semiconductor layer that are located at opposite sides of the second semiconductor layer; and
(i) forming a gate electrode so as to overlap the second, third, and fourth semiconductor layers.

12. The method of manufacturing a semiconductor device according to claim 11, further comprising:
between the step (h) and the step (i),
(j) implanting an n-type impurity into part of the first semiconductor layer to form the source region and the drain region; and
(k) implanting a p-type impurity into part of the second semiconductor layer to form the source region and the drain region.

13. The method of manufacturing the semiconductor device according to claim 11, wherein a step formed on a surface of a base film lying under the gate electrode is not larger than a thickness of the second semiconductor layer.

14. The method of manufacturing the semiconductor device according to claim 11, wherein a concentration of the p-type impurity in the main portion of the second semiconductor layer is lower than a concentration of the p-type impurity in the main portion of the first semiconductor layer.

15. The method of manufacturing the semiconductor device according to claim 11, wherein the slanted portion of the second semiconductor layer has a portion that is extended along the channel direction, and wherein, of the portion that is extended along the channel direction, a portion that overlaps the gate electrode has a lower p-type impurity concentration than a p-type impurity concentration of the slanted portion of the first semiconductor layer.

16. The method of manufacturing the semiconductor device according to claim 11, further comprising:
in the step (b),
preparing an amorphous semiconductor film that includes, in at least a part thereof, a catalytic element that facilitates crystallization; and
performing heat treatment to the amorphous semiconductor film for crystallizing at least part of the amorphous semiconductor film, thereby obtaining the semiconductor film.

17. The method of manufacturing the semiconductor device according to claim 11, further comprising:
forming a gate insulating film on the first and second semiconductor layers, wherein the gate insulating film is formed so as not to be thicker than the first and second semiconductor layers.

18. The method of manufacturing the semiconductor device according to claim 17, wherein the thickness of the gate insulating film is 50 nm or less.

\* \* \* \* \*